(12) United States Patent
Manders

(10) Patent No.: US 11,637,258 B2
(45) Date of Patent: Apr. 25, 2023

(54) DISPLAY DEVICES WITH DIFFERENT LIGHT SOURCES

(71) Applicant: Nanosys, Inc., Milpitas, CA (US)

(72) Inventor: Jesse R. Manders, Mountain View, CA (US)

(73) Assignee: Nanosys, Inc., Milpitas, CA (US)

( * ) Notice: Subject to any disclaimer, the term of this patent is extended or adjusted under 35 U.S.C. 154(b) by 213 days.

(21) Appl. No.: 16/938,239

(22) Filed: Jul. 24, 2020

(65) Prior Publication Data

US 2021/0028383 A1 Jan. 28, 2021

Related U.S. Application Data

(60) Provisional application No. 62/879,000, filed on Jul. 26, 2019.

(51) Int. Cl.
*H01L 27/32* (2006.01)
*H01L 51/50* (2006.01)
*H01L 51/52* (2006.01)

(52) U.S. Cl.
CPC ........ *H01L 51/502* (2013.01); *H01L 27/3211* (2013.01); *H01L 51/5265* (2013.01); *H01L 51/5284* (2013.01)

(58) Field of Classification Search
None
See application file for complete search history.

(56) References Cited

U.S. PATENT DOCUMENTS

| 2012/0298968 | A1* | 11/2012 | Kim | H01L 51/5088 |
| | | | | 257/40 |
| 2014/0183471 | A1* | 7/2014 | Heo | H01L 27/3209 |
| | | | | 257/40 |
| 2017/0221969 | A1 | 8/2017 | Steckel et al. | |
| 2020/0411784 | A1* | 12/2020 | Jang | H01L 51/502 |
| 2020/0411789 | A1* | 12/2020 | Ye | H01L 51/5096 |

* cited by examiner

*Primary Examiner* — Daniel Whalen
(74) *Attorney, Agent, or Firm* — EIP US LLP

(57) ABSTRACT

Embodiments of a display device are described. A display device includes first and second sub-pixels. The first sub-pixel includes a first light source having a quantum dot (QD) film, a blocking layer disposed on the QD film, and a first portion of an organic phosphor film disposed on the blocking layer and a first substrate configured to support the first light source. The blocking layer is configured to prevent emission of light from the first portion of the organic phosphor film and the QD film is configured to emit a primary emission peak wavelength in a red, green, cyan, yellow, or magenta wavelength region of an electromagnetic (EM) spectrum. The second sub-pixel includes a second light source and a second substrate configured to support the second light source. The second light source has a second portion of the organic phosphor film disposed adjacent to the QD film. The second portion of the organic phosphor film is configured to emit a primary emission peak wavelength in a blue, violet, or ultraviolet wavelength region of an EM spectrum.

16 Claims, 12 Drawing Sheets

DISPLAY DEVICES WITH DIFFERENT LIGHT SOURCES

CROSS REFERENCE TO RELATED APPLICATIONS

This application incorporates by reference in their entirety U.S. Provisional Appl. No. 62/879,000, filed Jul. 26, 2019.

BACKGROUND OF THE INVENTION

Field

The present invention relates to display devices having pixels with electroluminescent light sources (e.g., light emitting diodes (LEDs)).

Background

Display devices such as phones, tablets, computers, or televisions are typically made using liquid crystal displays (LCDs) having a backlight unit that provides white light from one or more white LEDs, or blue primary light from one or more blue LEDs. If the backlight is comprised of white LEDs, a color filter array (CFA) is used to produce red, green, and blue sub-pixels. If the backlight is comprised of blue LEDs, the blue primary light is down-converted and/or filtered using respective down-conversion phosphor films and/or color filter array (CFA) to produce red, green, and blue light emitted from respective red, green, and blue sub-pixels of the LCDs. Some of the drawbacks of using LCDs are wasted light and reduced luminance due to color filtering, wasted energy due to the backlight unit being always on, lack of individual control of the sub-pixels, and/or Stokes shift in the down-conversion from the blue primary light to the other colors.

To overcome some of the drawbacks of LCDs, display devices such as televisions can be made using white organic LEDs (WOLEDs), RGB OLEDs, or quantum dot LEDs (QLEDs), where each sub-pixel has its own WOLED, RGB OLED, or QLED based light source for individual control of the sub-pixels. However, these LED display devices also suffer from drawbacks. For example, WOLED display devices employ color filters in addition to the WOLEDs having blue and yellow/orange OLEDs for each sub-pixel to emit red, green, and blue light. So, there is wasted light and reduced luminance due to color filtering.

Display devices using RGB OLEDs have the blue OLEDs in their blue sub-pixels turned off when no blue light is needed. However, materials used for blue OLEDs have an operational lifetime that is shorter and an efficiency that is lower as compared to the properties of materials used for red and green OLEDs in their respective red and green sub-pixels. This causes differential aging and subsequent color shifting in RGB OLED- and WOLED display devices over time, leading to a "burn-in" phenomenon. Besides, there is also the problem of OLED light extraction in RGB OLED display devices. The microcavities that are used in the sub-pixels of RGB OLED display devices to enhance forward emission and increase color purity cause a precipitous drop of luminance, and often a dramatic color shift, at off-normal viewing angles.

SUMMARY

Accordingly, there is a need for improved light sources in LED display devices that overcome the above-mentioned limitations. To overcome the need for microcavities and achieve wider color gamut and viewing angle, QLEDs can be used to replace RGB OLEDs in LED display devices. QLED display devices can achieve narrow FWHM, wide color gamut, and a wide viewing angle without any extra outcoupling or other optical structures. Additionally, the QLEDs can be individually addressed at the subpixel level, thus leading to low power consumption and high contrast ratio. QLEDs can also reduce manufacturing costs of display devices because of high throughput manufacturing of QLEDs by employing large scale coating or printing techniques.

To overcome the challenge of achieving a longer operational lifetime and efficiency for the blue QLEDs in the blue sub-pixels compared to the red and green QLEDs in respective red and green sub-pixels, an LED display device can have QLED as light sources in its red and/or green sub-pixels and blue OLEDs as light sources in its blue sub-pixels. The blue OLEDs can improve the LED display device efficiency compared to current LED display devices using blue QLEDs.

According to some embodiments, a display device includes first and second sub-pixels. The first sub-pixel includes a first light source having a quantum dot (QD) film, a blocking layer disposed on the QD film, and a first portion of an organic phosphor film disposed on the blocking layer and a first substrate configured to support the first light source. The blocking layer is configured to prevent emission of light from the first portion of the organic phosphor film and the QD film is configured to emit a primary emission peak wavelength in a red, green, cyan, yellow, or magenta wavelength region of an electromagnetic (EM) spectrum. The second sub-pixel includes a second light source and a second substrate configured to support the second light source. The second light source has a second portion of the organic phosphor film disposed adjacent to the QD film. The second portion of the organic phosphor film is configured to emit a primary emission peak wavelength in a blue, violet, or ultraviolet wavelength region of the EM spectrum.

According to some embodiments, a display device includes a pixel having first, second, and third emission layers. The first and second emission layers have quantum dot (QD) films configured to emit first and second lights having first and second peak wavelengths, respectively. The first and second peak wavelengths are different from each other. The third emission layer has an organic phosphor film configured to emit a third light having a third peak wavelength different from the first and second peak wavelengths. A first portion of the third emission layer is disposed on the first emission layer and a second portion of the third emission layer is disposed adjacent to the first and second emission layers. The pixel further includes a blocking layer disposed between the first emission layer and the first portion of the third emission layer. The blocking layer is configured to prevent emission of light from the first portion of the third emission layer.

According to some embodiments, a display device includes first, second, and third sub-pixels configured to emit first, second, and third lights having first, second, and third peak wavelengths, respectively. The first, second, and third peak wavelengths are different from each other. The display device further includes first, second, and third emission layers. First and second emission layers have quantum dot (QD) films configured to emit the first and second lights and are disposed within the first, second, and third sub-pixels. The third emission layer has an organic phosphor film configured to emit the third light and is disposed within the first, second, and third sub-pixels. The display device further includes a cathode and an anode configured to provide negative and positive charges, respectively, to the first, second, and third emission layers. The first, second, and third emission layers are arranged in a tandem configuration between the cathode and the anode.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments disclosed herein and, together with the description, further serve to explain the principles of the present embodiments and to enable a person skilled in the relevant art(s) to make and use the present embodiments.

Figure 2:
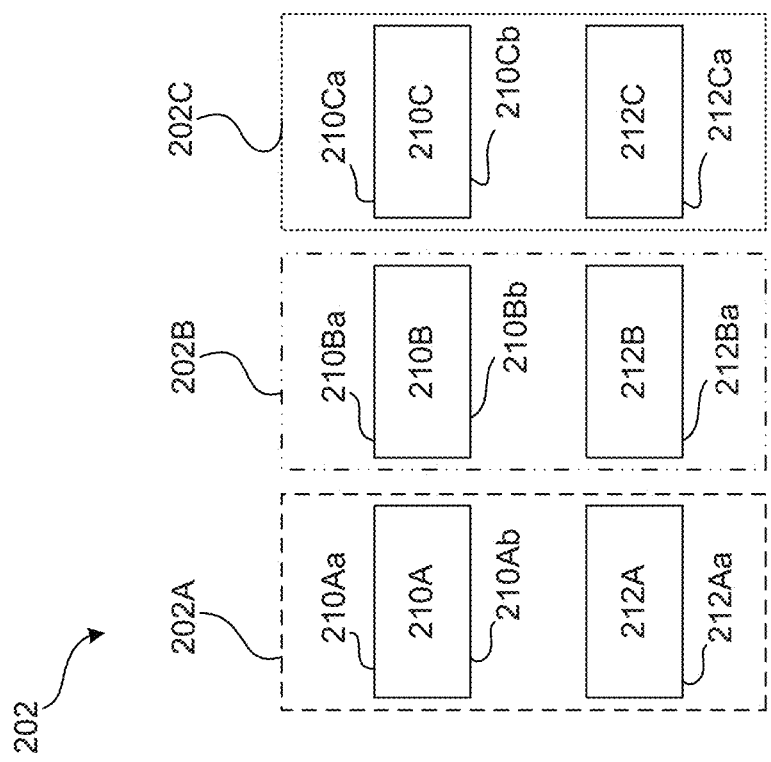
FIG. 2 illustrates an exploded cross-sectional view of a pixel of an LED display device, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements unless mentioned otherwise. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

It is noted that references in the specification to "one embodiment," "an embodiment," "an example embodiment," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

In embodiments, the term "display device" refers to an arrangement of elements that allow for the visible representation of data on a display screen. Suitable display screens can include various flat, curved or otherwise-shaped screens, films, sheets or other structures for displaying information visually to a user. Display devices described herein can be included in, for example, display systems encompassing a liquid crystal display (LCD), televisions, computers, monitors, mobile phones, smart phones, personal digital assistants (PDAs), gaming devices, electronic reading devices, digital cameras, tablets, wearable devices, car navigation systems, digital signage, augmented reality, virtual reality, and the like.

In some embodiments, the terms "about" and "substantially" can indicate a value of a given quantity that varies within 5% of the value (e.g., ±1%, ±2%, ±3%, ±4%, ±5% of the value).

In embodiments, the term "optically coupled" means that components are disposed such that light is able to pass from one component to another component without substantial interference.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell can contain non-crystalline regions and can even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The term "nanostructure (NS) film" is used herein to refer to a film having luminescent nanostructures.

The term "red sub-pixel" is used herein to refer to an area of a pixel that emits light having a primary emission peak wavelength in the red wavelength region of the visible spectrum. In some embodiments, the red wavelength region can include wavelengths ranging from about 620 nm to about 750 nm.

The term "green sub-pixel" is used herein to refer to an area of a pixel that emits light having a primary emission peak wavelength in the green wavelength region of the visible spectrum. In some embodiments, the green wavelength region can include wavelengths ranging from about 495 nm to about 570 nm.

The term "blue sub-pixel" is used herein to refer to an area of a pixel that emits light having a primary emission peak wavelength in the blue wavelength region of the visible spectrum. In some embodiments, the blue wavelength region can include wavelengths ranging from about 435 nm to about 495 nm.

The term "partially reflective surface" is used herein to refer to a surface that has reflectivity between about 20% and about 90%.

The term "partially transparent" or "semitransparent" is used herein to refer to an element or a surface that has transmissivity between about 20% and about 90%.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

This disclosure provides various embodiments of LED display devices that overcome the above-mentioned limitations of display devices with blue QLEDs. In some embodiments, an LED display device can have QLED as light sources in its red and/or green sub-pixels and OLED as light sources in its blue sub-pixels. The blue OLEDs can improve the LED display device efficiency compared to LED display devices with blue QLEDs in their blue sub-pixels. The improved LED display device efficiency can be due to the higher energy efficiency of blue OLEDs compared to blue QLEDs. The blue OLEDs can also improve the LED display device lifetime compared to display devices with blue QLEDs in their blue sub-pixels. The improved LED display lifetime can be due to the longer lifetime of blue OLEDs compared to blue QLEDs.

Example Embodiments of LED Display Devices

Figure 1:
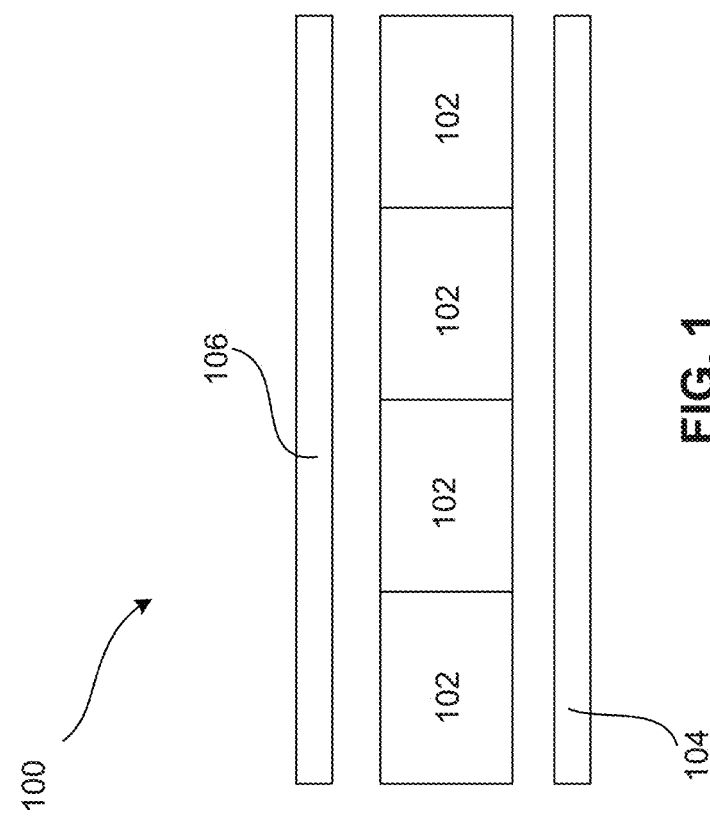
FIG. 1 illustrates an exploded cross-sectional view of a light emitting diode (LED) display device, according to some embodiment.

FIG. 1 illustrates a schematic of an exploded cross-sectional view of a light emitting diode (LED) display device 100, according to some embodiments. LED display device 100 can include a back plate 104, a plurality of pixels 102 arranged in a 2-D array on back plate 104, and a transmissive cover plate 106, according to some embodiments. The number of pixels shown in FIG. 1 is illustrative and is not limiting. Device 100 can have any number pixels without departing from the spirit and scope of this disclosure. Device 100 can be referred to as an organic LED (OLED) display device if OLED-based light sources are used in pixels 102, as a quantum dot LED (QLED) display device if QLED-based light sources are used in pixels 102, or a hybrid LED display device if a combination of OLEDs and QLEDs are used in pixels 102.

Cover plate 106 can serve as a display screen to generate images and/or can be configured to provide environmental sealing to underlying structures of device 100. Cover plate 106 can be also configured to be an optically transparent substrate onto which other components (e.g., electrodes) of device 100 can be disposed. In some embodiments, pixels 102 can be tri-chromatic having red, green, and blue sub-pixels. In some embodiments, pixels 102 can be monochromatic having either red, green, or blue sub-pixels. In some embodiments, device 100 can have a combination of both tri-chromatic and monochromatic pixels 102.

Device 100 can further include control circuitry (not shown) of pixels 102. Pixels 102 can be independently controlled by switching devices, such as thin film transistors (TFTs), as would become apparent to a person skilled in the art. Device 100 can have a geometric shape, such as but not limited to cylindrical, trapezoidal, spherical, or elliptical, according to some embodiments, without departing from the spirit and scope of the present invention. It should be noted that even though back plate 104, array of pixels 102, and cover plate 106 are shown in FIG. 1 to have similar dimensions along X-axis, a person skilled in the art would understand that each of these components can have dimensions different from each other in one or more directions, according to some embodiments.

FIG. 2 illustrates an exploded cross-sectional view of a tri-chromatic pixel 202 of an LED display device, according to some embodiments. One or more of pixels 102 of device 100 of FIG. 1 can have a configuration similar to pixel 202. Pixel 202 can include a red sub-pixel 202A, a green sub-pixel 202B, and a blue sub-pixel 202C. The arrangement order of red, green, and blue sub-pixels 202A-202C is illustrative and is not limiting and can be arranged in any order with respect to each other.

Each of red, green, and blue sub-pixels 202A-202C can include a respective LED-based light source 210A-210C. In some embodiments, each of light sources 210A-210C can be configured to provide a respective primary red, green, and blue light that can be transmitted to and distributed across a display screen (e.g., cover plate 106) of an LED display device (e.g., device 100). In some embodiments, light sources 210A-210C can be configured to emit light from surfaces 210Aa-210Ca, respectively, when pixel 202 is part of a top emission LED display or from surfaces 210Ab-210Cb, respectively, when pixel 202 is part of a bottom emission LED display.

In some embodiments, light source 210A can be configured to emit light having a primary emission peak wavelength in the red wavelength region of the visible spectrum. The red wavelength region can include wavelengths ranging from about 620 nm to about 750 nm. In some embodiments, light source 210B can be configured to emit light having a primary emission peak wavelength in the green wavelength region of the visible spectrum. The green wavelength region can include wavelengths ranging from about 495 nm to about 570 nm. In some embodiments, light source 210C can be configured to emit light having a primary emission peak wavelength in the blue wavelength region of the visible spectrum. The blue wavelength region can include wavelengths ranging from about 435 nm to about 495 nm.

In some embodiments, each of red, green, and blue sub-pixels 202A-202C can further include a substrate 212A-212C, respectively, configured to support respective light sources 210A-210C. Substrates 212A-212C can be further configured to support control circuitry (e.g., TFTs) for independently controlling respective red, green, and blue sub-pixels 202A-202C. In some embodiments, substrates 212A-212C can be optically transparent when pixel 202 is part of a bottom emission LED display device or can be optically reflective, opaque, transparent, or semi-transparent when pixel 202 is part of a top emission LED display device. Substrates 212A-212C can be portions of a single substrate 212 (not shown in FIG. 2; shown in FIGS. 3-14), according to some embodiments.

In some embodiments, each of red, green, and blue sub-pixels 202A-202C can further include optional color processing elements (not shown in FIG. 2). The optional color processing elements can include one or more phosphor films and/or color filters disposed on surfaces 210Aa-210Ca in a top emission LED display device or on surfaces 212Aa-212Ca in a bottom emission LED display device. In some embodiments, the optional color processing elements can be part of light sources 210A-210C, or cover plate 106 in the top emission LED display device or can be part of substrates 212A-212C or back plate 104 in the bottom emission display device. The one or more phosphor films of the optional color processing elements can have luminescent nanostructures (NS) such as QDs (e.g., NS 1500 described with reference to FIG. 15).

FIGS. 3-14 illustrate cross-sectional views of tri-chromatic pixels 302-1402, respectively, of an LED display device, according to some embodiments. Each of pixels 302-1402 can represent an example embodiment of pixel 202. Pixels 302-1402 can include red sub-pixels 302A-1402A, green sub-pixels 302B-1402B, and blue sub-pixels 302C-1402C, respectively. The red, green, and blue light emitted from each of these sub-pixels are represented by black arrows. The black arrows pointing towards +Z-direction indicates emission of light from top of the display device, and the black arrows pointing towards −Z-direction indicates emission of light from bottom of the display device.

Each of sub-pixels 302A-1402A (FIGS. 3-14), 302B-1402B (FIGS. 3-14), and 302C-1402C (FIGS. 3-14) can represent an example embodiment of sub-pixels 202A-202C, respectively. The arrangement order of these red, green, and blue sub-pixels 302A-1402A, 302B-1402B, and 302C-1402C of respective pixels 302-1402 is illustrative and is not limiting and can be arranged in any order with respect to each other. Each portion of red sub-pixels 302A-1402A, green sub-pixels 302B-1402B, and blue sub-pixels 302C-1402C disposed on substrate 212 can represent an example embodiment of light sources 210A-210C, respectively.

The discussion of elements with the same annotations in FIGS. 1-16 applies to each other unless mentioned otherwise. The elements described in this disclosure as being on or over other elements can be directly on with the other elements or can have intervening layers unless mentioned otherwise. It should be noted that even though some of the elements of FIGS. 3-14 are shown to have similar dimensions along X- and Z-axes with respect to each other, each of these elements can have dimensions different from each other in one or more directions, according to some embodiments.

In some embodiments, the red, green, and blue sub-pixels of each pixels 302-1402 (FIGS. 3-14) can include light sources that are same or different from each other. These light sources can be OLEDs, QLEDs, or a combination thereof. In some embodiments, the light sources of the red and green sub-pixels of each pixels 302-1402 can be similar to each other, but different from the light source of the blue sub-pixel. The blue sub-pixel of each pixels 302-1402 can have blue, violet, or UV OLED light source, while the red and green sub-pixels have QLED light sources to overcome the above-mentioned problems of achieving longer operational lifetime and efficiency for blue sub-pixels. Blue, violet, or UV OLEDs have longer operational lifetime compared to other blue, violet, or UV light sources (e.g., QLEDs).

Figure 3:
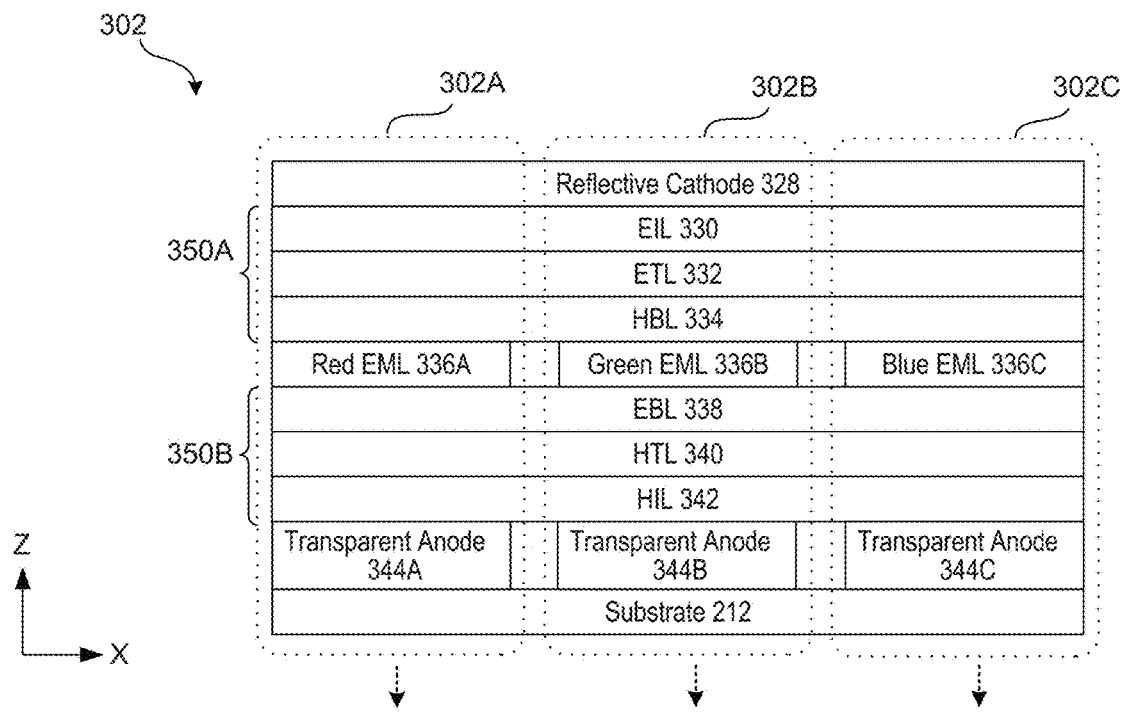
FIGS. 3-14 illustrate cross-sectional views of pixels of LED display devices, according to some embodiments.

Referring to FIG. 3, pixel 302 can represent a pixel structure of a bottom emission LED display device, where light can be emitted through substrate 212 towards a display screen (e.g., back plate 104). Red, blue, and green light (represented by black arrows) from respective red, green, and blue sub-pixels of pixels 302A-302C can be emitted through substrate 212. Each portion of red sub-pixel 302A, green sub-pixel 302B, and blue sub-pixel 302C disposed on substrate 212 can represent an example embodiment of light sources 210A-210C, respectively. Pixel 302 can include multi-layer stacks 350A-350B and a reflective cathode 328 shared by red, green, and blue sub-pixels 302A-302C. Red, green, and blue sub-pixels 302A-302C can include transparent anodes 344A-344C and EMLs 336A-336C, respectively.

In some embodiments, each of EMLs 336A-336B can include one or more QD-based phosphor films (e.g., NS film 1600 described with reference to FIG. 16) and EML 336C can include one or more organic phosphor films. As such, the stack of layers on substrate 212 within red and green sub-pixels 302A-302B can form QLED-based light source, respectively, and the stack of layers on substrate 212 within blue sub-pixel 302C can form OLED-based light source. In some embodiments, the QD-based phosphor film can include luminescent NSs such as QDs (e.g., NS 1500 described with reference to FIG. 15). In some embodiments, EMLs 336A-336B can be different regions of a continuous film and may not be separated from each other as shown in FIG. 3. EMLs 336A-336B can be formed by, for example, spin coating, inkjet printing, slot die coating, nozzle printing, contact printing, a suitable solution printing technology, thermal evaporation, or a suitable vapor deposition technology.

The size and material of QDs of the QD-based phosphor film in red and green EMLs 336A-336B can be selected such that red and green sub-pixels 302A-302B can emit red and green lights when a voltage is applied across the stack of layers within red and green sub-pixels 302A-302B, respectively, during operation. The red and green lights can be produced when the voltage is applied because electrons and holes recombine in red and green EMLs 336A-336B to emit photons corresponding to wavelengths in the red and green wavelength regions, respectively, of the visible spectrum. The electrons and holes can be injected from cathode 328 and anode 344, respectively, when the voltage is applied such that anode 344 is positive with respect to cathode 328. In some embodiments, the red wavelength region can include wavelengths ranging from about 620 nm to about 750 nm and the green wavelength region can include wavelengths ranging from about 495 nm to about 570 nm.

The organic material of the organic phosphor film in blue EML 336C can be selected such that blue sub-pixel 302C can emit blue light when a voltage is applied across the stack of layers within blue sub-pixel 302C during operation. Similar to the red and green EMLs 336A-336B, blue light can be produced when the voltage is applied because electrons and holes recombine in blue EML 336C to emit photons corresponding to wavelengths in the blue wavelength region of the visible spectrum. In some embodiments, the blue wavelength region can include wavelengths ranging from about 435 nm to about 495 nm.

Transparent anodes 344A-344C can be configured to inject holes to the overlying layers when positively biased during operation, as discussed above. Anodes 344A-344C can include electrically conductive and optically transparent materials, such as indium-tin-oxide (ITO), according to some embodiments. In some embodiments, anodes 344A-344C can be formed as separate anodes on substrate 212 by depositing and patterning the electrically conductive and optically transparent materials on substrates 212. The deposition can be performed by, for example, sputtering, thermal evaporation, or a suitable method for depositing electrically conductive and optically transparent materials. The patterning can be performed by, for example, a lithography process or a masking process during the deposition. In some embodiments, an insulating matrix (not shown) can be formed between anodes 344A-344C to electrically and/or optically isolate them from each other.

Multi-layer stack 350A can include a hole injection layer (HIL) 342 disposed on transparent anodes 344A-344C, a hole transport layer (HTL) 340 disposed on HIL 342, and an electron blocking layer (EBL) 338 disposed on HTL 340. Multi-layer stack 350B can include a hole blocking layer (HBL) 334 disposed on EMLs 336A-336C, an electron transport layer (ETL) 332 disposed on HBL 334, and an electron injection layer (EIL) 330 disposed on ETL 332.

HIL 342 can be configured to facilitate the injection of holes from anodes 344A-344C into HTL 340. In some embodiments, HIL 342 can include p- or n-type, organic or inorganic semiconductor materials, such as metal oxides (e.g., nickel oxide (NiO), molybdenum oxide ($MoO_3$), vanadium oxide ($V_2O_5$), tungsten oxide ($WO_3$)), polyanilines, polythiophenes (e.g., poly(3,4-ethylenedioxythiophene) doped with poly(styrene sulfonate)), Tris[phenyl(m-tolyl) amino]triphenylamine (mTDATA), or hexaazatriphenylene-hexacarbonitrile (HAT-CN). HILs 342 can be deposited on anodes 344A-344C by, for example, spin coating, inkjet printing, slot die coating, nozzle printing, contact printing, a suitable solution printing technology, thermal evaporation, or a suitable vapor deposition technology.

HTL 340 can be configured to facilitate the transportation of holes from HIL 342 to overlying EML (e.g., EMLs 336A, 336B, and/or 336C). In some embodiments, HTL 340 can include p-type, organic or inorganic semiconductor materials, such as metal oxides or nanostructures of metal oxides (e.g., nickel oxide (NiO), molybdenum oxide ($MoO_3$), vanadium oxide ($V_2O_5$), or tungsten oxide ($WO_3$)), or polymers (e.g., poly(N-vinylcarbazole), poly(triarylamines), triphenylamine derivatives, or carbazole derivatives), or small organic molecules (e.g. N,N'-Di(1-naphthyl)-N,N'-diphenyl-(1,1'-biphenyl)-4,4'-diamine (NPB)).

In some embodiments, HTL 340 and HIL 342 can include material similar or different from each other. In some embodiments, HTL 340 can be deposited on HIL 342 by, for example, spin coating, inkjet printing, slot die coating, nozzle printing, contact printing, a suitable solution printing technology, thermal evaporation, or a suitable vapor deposition technology.

Optionally, EBL 338 can be formed on HTL 340 as intervening layers between overlying EML (e.g., EMLs 336A, 336B, and/or 336C) and HTL 340. EBL 338 can be configured to block electrons from escaping the overlying EML by acting as a large energy barrier between HTL 340 and EMLs 336A-336C. EBL 338 can include p-type semiconductor materials that have a shallow conduction band, such as carbazole and triphenylene based organic compounds. In some embodiments, EBL 338 can be deposited on HTL 340 by, for example, spin coating, inkjet printing, slot die coating, nozzle printing, contact printing, a suitable solution printing technology, thermal evaporation, or a suitable vapor deposition technology.

Similar to EBL 338, HBL 334 can be optionally formed as intervening layers between underlying EML (e.g., EMLs 336A, 336B, and/o 336C) and ETL 332. HBLs 334 can be configured to block holes from escaping EMLs 336A-336C by acting as a large energy barrier between ETL 332 and EMLs 336A-336C. HBL 334 can include n-type semiconductor materials that have a deep valence band, such as substituted benzimidazoles organic compounds. In some embodiments, HBL 334 can formed by, for example, spin coating, inkjet printing, slot die coating, nozzle printing, contact printing, a suitable solution printing technology, thermal evaporation, or a suitable vapor deposition technology.

ETL 332 can be formed on HBL 334 or on underlying EML (e.g., EMLs 336A, 336B, and/or 336C) if HBL 334 is optionally not included. ETL 332 can be configured to facilitate the transportation of electrons from EIL 330 to EMLs 336A-336C. In the absence of HBL 334, ETL 332 can be configured to block holes from escaping the underlying EML (e.g., EMLs 336A, 336B, and/or 336C). In some embodiments, ETL 332 can include n-type, organic or inorganic semiconductor materials, such as metal oxides or nanostructures of metal oxides (e.g., zinc oxide (ZnO), zinc magnesium oxide (ZnMgO), or titanium oxide ($TiO_2$)) or benzimidazole derivatives. In some embodiments, ETL 332 can be formed by, for example, spin coating, inkjet printing, slot die coating, nozzle printing, contact printing, a suitable solution printing technology, thermal evaporation, or a suitable vapor deposition technology.

EIL 330 can be configured to facilitate the injection of electrons from reflective cathodes 328 into ETL 332 by forming an ohmic or near ohmic contact with reflective cathodes 328. In some embodiments, EIL 330 can include n-type semiconductor materials, alkali metal salts (e.g., lithium flouride (LiF) or cesium carbonate ($Cs_2CO_3$)), low work function metals (e.g., calcium (Ca), barium (Ba), magnesium (Mg), ytterbium (Yb), or cesium (Cs)), or organic compounds (e.g., polyfluorenes, polyethylenimine ethoxylated (PETE), or lithium-8-hydroxyquinolinolate (Liq)). In some embodiments, ETL 332 and EIL 330 can include material similar or different from each other. EIL 330 can be deposited on ETL 332 by, for example, spin coating, inkjet printing, slot die coating, nozzle printing, contact printing, a suitable solution printing technology, thermal evaporation, or a suitable vapor deposition technology.

In some embodiments, pixel 302 can include a plurality of EIL 330, ETL 332, HTL 340, and HIL 342. Each EIL 330, ETL 332, HTL 340, and HIL 342 can include material similar or different from each other, respectively. In some embodiments, instead of a common EIL 330, ETL 332, HTL 340, and HIL 342 between red, green, and blue sub-pixels 302A-302C as shown in FIG. 3, red, green, and blue sub-pixels 302A-302C can each have a separate EIL 330, ETL 332, HTL 340, and HIL 342.

Reflective cathode 328 can be configured to inject electrons to the underlying layers when negatively biased during operation, as discussed above. Cathode 328 can include electrically conductive and optically reflective materials, such as aluminum (Al) or silver (Ag), according to some embodiments. In some embodiments, cathode 328 can include at least one non-reflective electrically conductive layer (e.g., ITO, Yb, or Mg:Ag alloy) and at least one reflective layer (e.g., Ag or Al). The reflective materials or layers of reflective cathodes 328 can help to reflect light towards substrate 212 and prevent light from being emitted through cathode 328. The light that is produced due to the emission of photons after the recombination of electrons and holes in EMLs 336A-336C (discussed above) can travel towards cathode 328 and substrate 212. The reflective materials or layers of cathode 328 can redirect these photons towards substrate 212 for emission from red, green, and blue sub-pixels 302A-302C.

In some embodiments, cathode 328 can be formed by depositing and patterning the cathode materials on EIL 330. The deposition can be performed by, for example, sputtering, thermal evaporation, a suitable solution printing technology, or a suitable method for depositing electrically conductive and optically reflective materials. The patterning can be performed by, for example, a lithography process.

Figure 4:
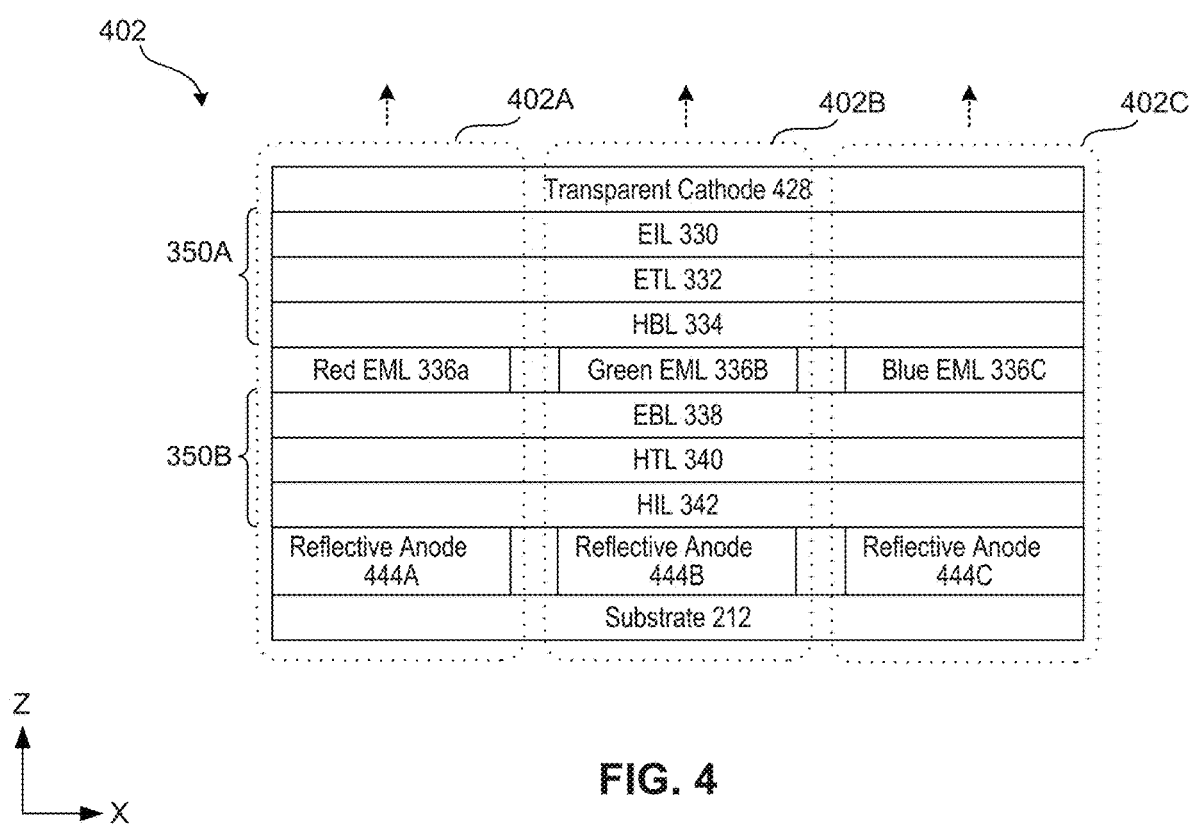

FIG. 4 illustrates a cross-sectional view of a tri-chromatic pixel 402 of a top emission LED display device. The discussion of pixel 302 applies to pixel 402 unless mentioned otherwise. Pixel 402 can represent a pixel structure of a top emission LED display device, where light can be emitted through transparent cathode 428 towards a display screen (e.g., back plate 104). Red, blue, and green light (represented by black arrows) from respective red, green, and blue sub-pixels of pixels 402A-402C can be emitted through transparent cathode 428. Each portion of red sub-pixel 402A, green sub-pixel 402B, and blue sub-pixel 402C disposed on substrate 212 can represent an example embodiment of light sources 210A-210C, respectively.

Pixel 402 can have transparent cathode 428 and reflective anodes 444-444C instead of reflective cathode 328 and transparent anodes 344A-344C as in pixel 302. Similar to cathodes 328 and anodes 344A-344C, cathode 428 and anodes 444A-444C can be configured to inject electrons and holes, respectively, into the layers of red, green, and blue sub-pixels 402A-402C to produce red, green, and blue lights, respectively. Cathodes 428 can include optically transparent material as red, green, and blue lights are emitted through it. In addition, reflective anodes 444A-444C can include optically reflective material for increased light output efficiency and to prevent red, green, and blue lights from leaking through substrate 212.

In some embodiments, cathode 428 can include electrically conductive and optically transparent layers, such as a layer of ITO, a multilayer stack of ITO/Ag/ITO, or a thin layer of Ag having a thickness of about 10 nm. In some embodiments, anodes 444A-444C can include electrically conductive and optically reflective layers, such as Al, Ag, or multi-layered $TiO_2/SiO_2$. In some embodiments, anodes 444A-444C can include a non-reflective electrically conductive layer (e.g., ITO) and a reflective layer (e.g., Ag or Al). The reflective layer can be formed directly on substrate 212.

Figure 5:
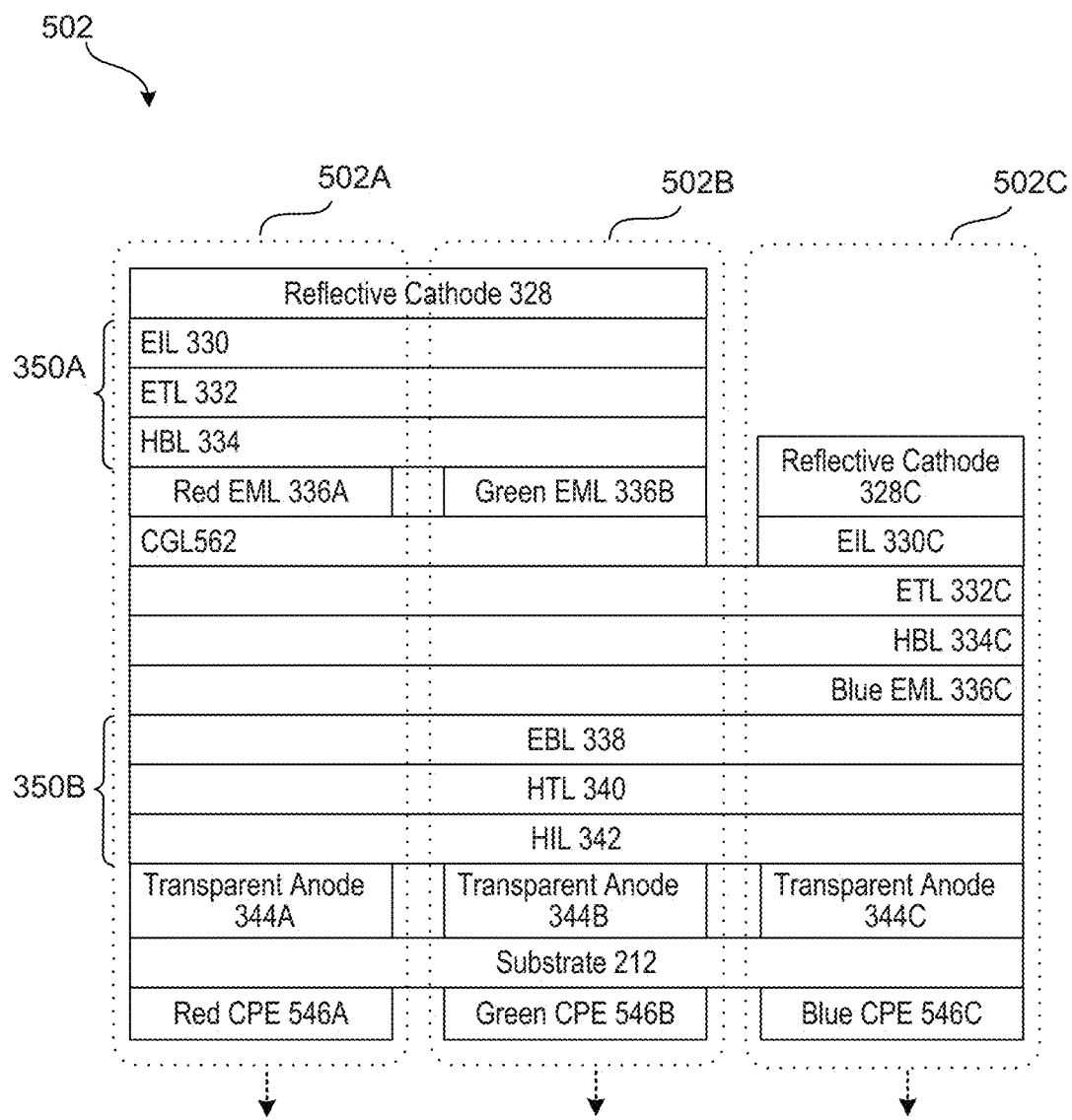

FIG. 5 illustrates a cross-sectional view of a tri-chromatic pixel 502 of a bottom emission LED display device. The discussion of pixel 302 applies to pixel 502 unless mentioned otherwise. Similar to pixel 302, pixel 502 can have red and green EMLs 336A-336B adjacent to each other, but blue EML 336C can be non-adjacent to red and green EMLs 336A-336B. In pixel 502, red and green EMLs 336A-336B can be disposed on blue EML 336C, which can be a continuous layer within red, green, and blue sub-pixels 502A-502C. Blue EML 336C can be deposited as a continuous layer for the ease and cost effectiveness of manufacturing the one or more organic phosphor films included in blue EML 336C.

Similar to pixel 302, pixel 502 can have reflective cathode 328 and stack 350A including EIL 330, ETL 332, and HBL 334 shared by red and green sub-pixels 502A-502B, but blue sub-pixel 502C can have separate reflective cathode 328C, EIL 330C, ETL 332C, and HBL 334C to facilitate injection and transport of electrons to blue EML 336C and to block holes from escaping blue EML 336C. The above discussion of reflective cathode 328, EIL 330, ETL 332, and HBL 334 applies to reflective cathode 328C, EIL 330C, ETL 332C, and HBL 334C, unless mentioned otherwise. In some embodiments, ETL 332C and HBL 334C can be continuous layers within red, green, and blue sub-pixels 502A-502C as shown in FIG. 5.

Red and green sub-pixels 502A-502B can have red and green color processing elements (CPEs) 546A-546B configured to filter out blue light that may emit from portions of blue EML 336C within red and green sub-pixels 502A-502B, respectively. Blue sub-pixel 502C can have blue CPE 546C configured to tune the wavelength of the blue light emitted from blue sub-pixel 502C. Each of CPEs 546A-546C can have one or more non-phosphor films that exclude luminescent nanostructures such as QDs (e.g., NS 1500 described with reference to FIG. 15).

In some embodiments, instead of separate red and green EMLs 336A-336B as shown in FIG. 5, red and green EMLs 336A-336B can be shared between red and green sub-pixels 502A-502B. In this case, red CPE 546A can be configured to filter out green and/or blue lights that may emit from portions of EMLs 336B-336C within red sub-pixel 502A, respectively. Similarly, green CPE 546B can be configured to filter out red and/or blue lights that may emit from portions of EMLs 336A and 336C within green sub-pixel 502B, respectively. The stacking order of red and green EMLs 336A-336B when shared between red and green sub-pixels 502A-502B can be such that light emitted from one EML is not substantially absorbed by the other EML. As green EML 336B that produces green light has wider energy bandgap material than the material of EML 336A that produces red light, red EML 336A can be placed on green EML 336B. The energy bandgap of green EML 336B's material can be wide enough that energy from red light of red EML 336A does not excite electrons of green EML's 336B's material across the energy bandgap to the conduction band and cause absorption of the red light. So, the red light from red EML 336A can pass through green EML 336B towards substrate 212.

In some embodiments, pixel 502 can include a charge generation layer (CGL) 562 between blue EML 336C and red and/or green EMLs 336A-336B. CGL 562 can be configured to provide electrons to overlying layers (e.g., red and/or green EMLs 336A-336B) and holes to underlying layers (e.g., ETL 332C and/or blue EML 336C). In some embodiments, CGL 562 can include a pair of layers. A first layer of the pair of layers can be configured to provide the electrons and can include alkali metal salts such as LiF, low work function metals such as Ca, Ba, and n-doped material. A second layer of the pair of layers can be configured to provide the holes and can include arylamine based hole transport host and electron accepting dopant (e.g. charge transfer salts), strongly electron accepting small organic molecules, and/or metal oxides. CGL 562 can be formed by, for example, spin coating, inkjet printing, slot die coating, nozzle printing, contact printing, a suitable solution printing technology, thermal evaporation, or a suitable vapor deposition technology.

Figure 6:
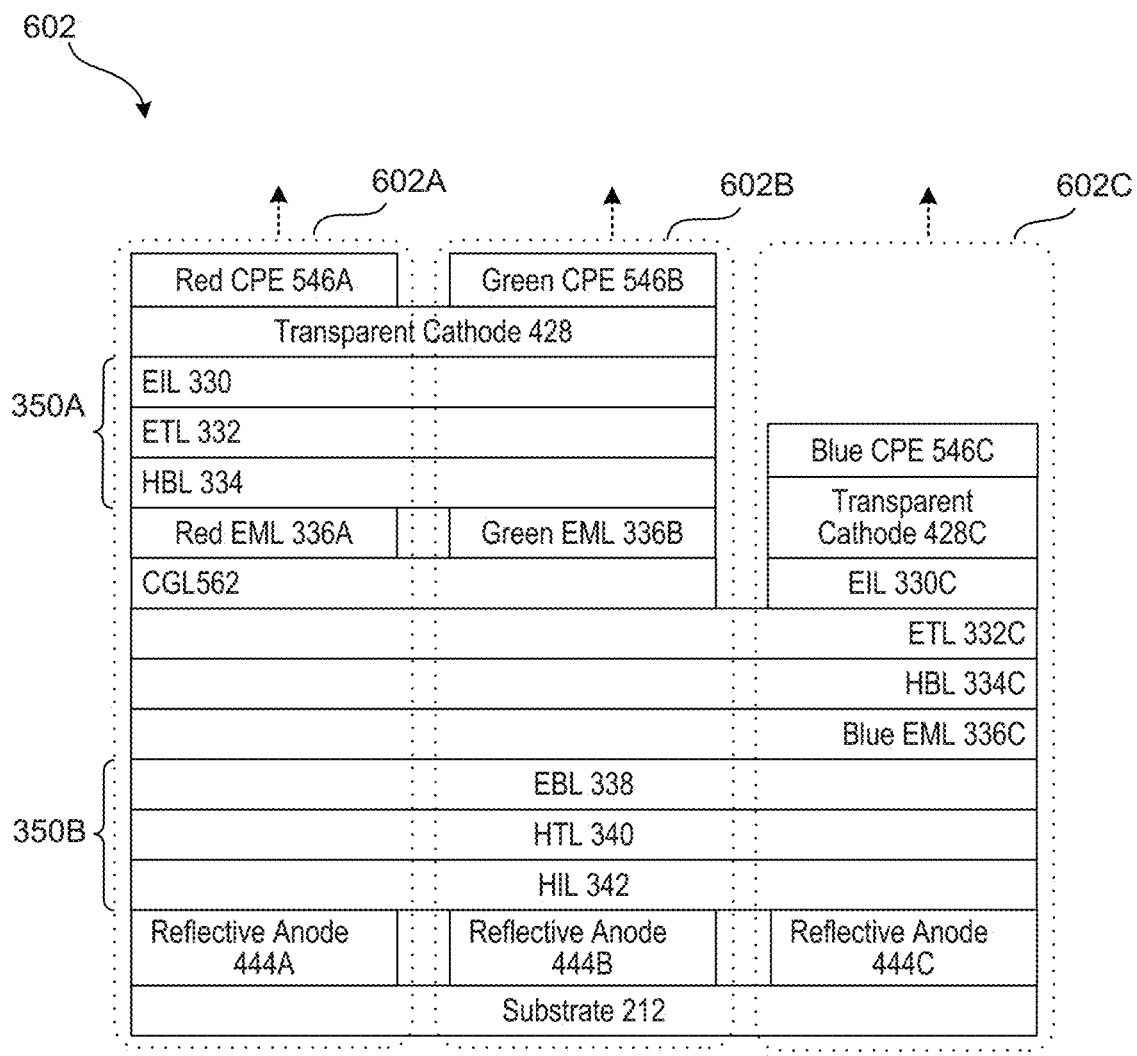
Figure 6:
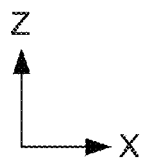

FIG. 6 illustrates a cross-sectional view of a tri-chromatic pixel 602 of a top emission LED display device. Pixel 602 can be similar to pixel 502, except in pixel 602 red and green lights can be emitted through transparent cathode 428 and blue light can be emitted through transparent cathode 428C towards a display screen (e.g., back plate 104). Also, pixel 602 can have transparent cathodes 428 and 428C instead of reflective cathodes 328 and 328C, and reflective anodes 444-444C instead of transparent anodes 344A-344C as in pixel 502. Further, red and green CPEs 546A-546B can be disposed on transparent cathode 428 and blue CPE 546C can be disposed on transparent cathode 428C instead of under substrate 212 as in pixel 502.

As discussed with reference to FIG. 5, in some embodiments, red and green EMLs 336A-336B can be stacked and shared between red and green sub-pixels 602A-602B. However, the stacking order of red and green EMLs 336A-336B when shared between red and green sub-pixels 502A-502B in pixel 602 is opposite to that in pixel 502. In pixel 602, green EML 336B can be placed on red EML 336A so that the red light from EML 336A can pass through EML 336B towards cathode 428 because green EML 336B that produces green light has wider energy bandgap material than the material of EML 336A that produces red light.

Figure 7:
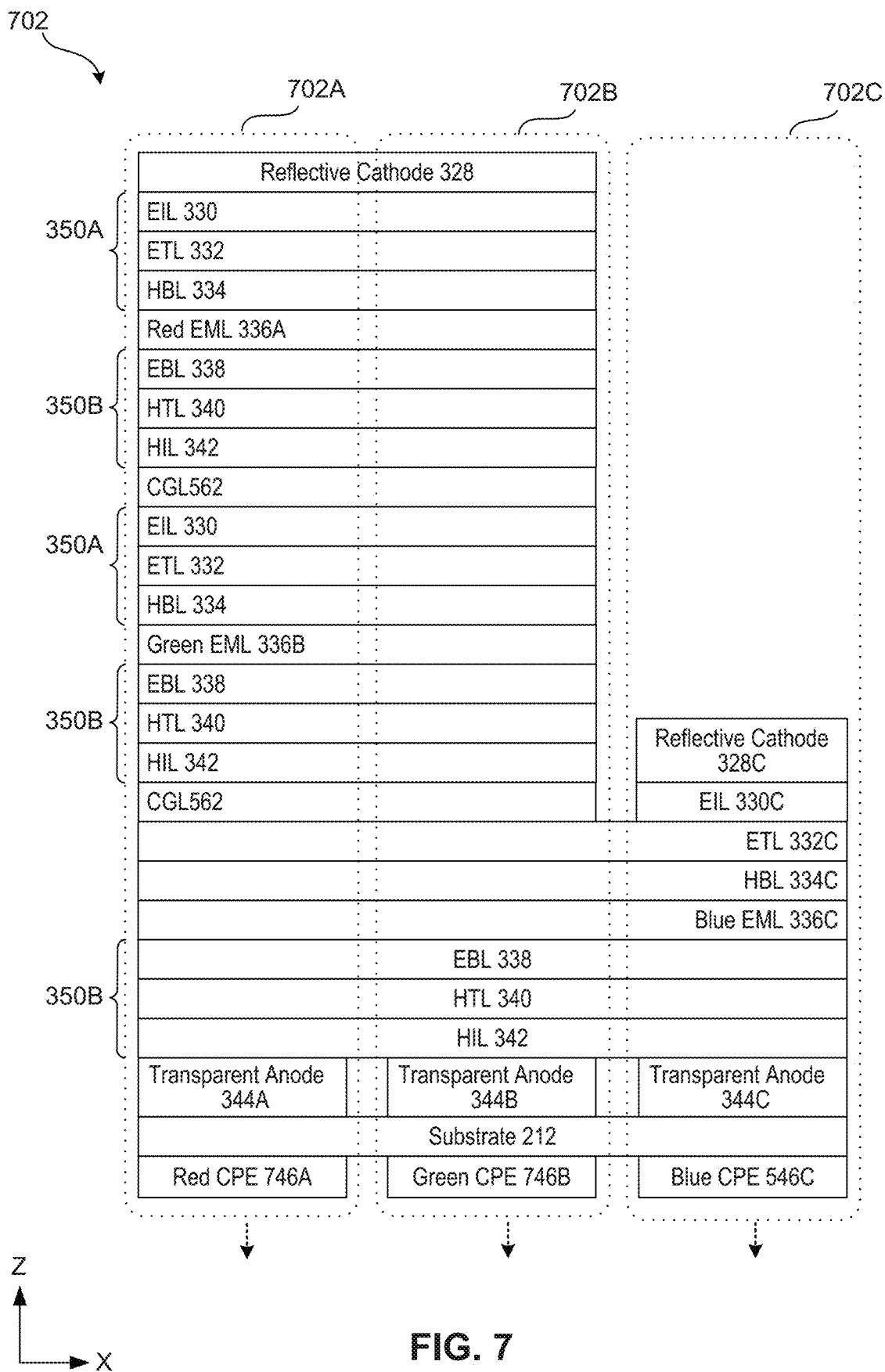

FIG. 7 illustrates a cross-sectional view of a tri-chromatic pixel 702 of a bottom emission LED display device. The discussion of pixel 502 applies to pixel 702 unless mentioned otherwise. In pixel 702, red and green EMLs 336A-336B can be shared between red and green sub-pixels 702A-702B and red EML 336A can be disposed on green EML 336B. Each of red and green EMLs 336A-336B can be interposed between stacks 350A-350B, instead of sharing stacks 350A-350B as in pixel 502. Red and green EMLs 336A-336B can be deposited as continuous layers between red and green sub-pixels 702A-702B for the ease and cost effectiveness of manufacturing the one or more QD-based phosphor films included in red and green EMLs 336A-336B. Pixel 702 can also include a pair of CGLs 562 configured to provide electrons to overlying layers and holes to underlying layers as shown in FIG. 7.

In addition, pixel 702 can include red and green CPEs 746A-746B. Red CPE 746A can be configured to filter out green and/or blue lights that may emit from portions of EMLs 336B-336C within red sub-pixel 702A, respectively. Similarly, green CPE 746B can be configured to filter out red and/or blue lights that may emit from portions of EMLs 336A and 336C within green sub-pixel 702B, respectively. Each of CPEs 746A-746B can have one or more non-phosphor films that exclude luminescent nanostructures such as QDs (e.g., NS 1500 described with reference to FIG. 15).

Figure 8:
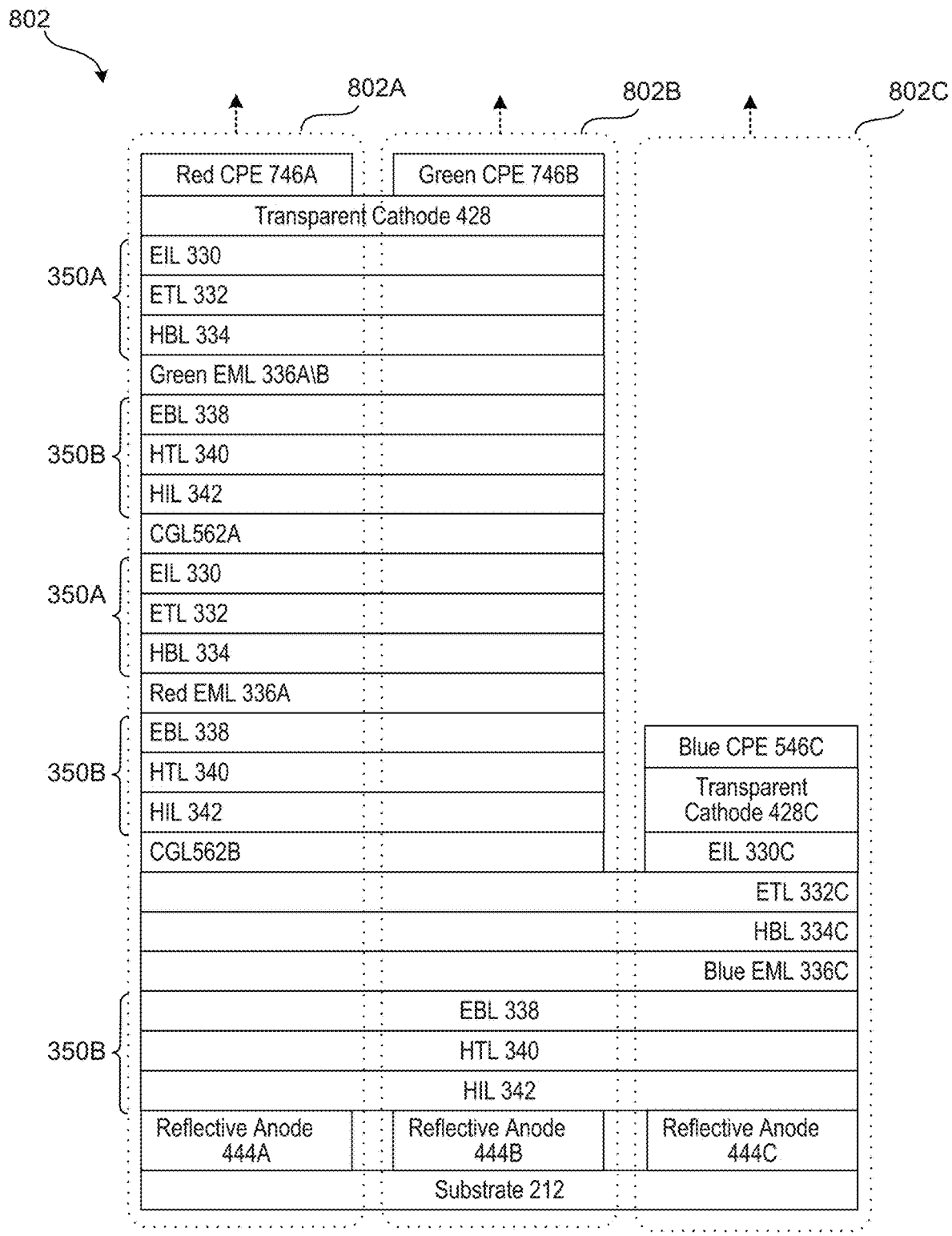

FIG. 8 illustrates a cross-sectional view of a tri-chromatic pixel 802 of a top emission LED display device. Pixel 802 can be similar to pixel 702, except in pixel 802 red and green lights can be emitted through transparent cathode 428 and blue light can be emitted through transparent cathode 428C towards a display screen (e.g., back plate 104). Also, pixel 802 can have transparent cathodes 428 and 428C instead of reflective cathodes 328 and 328C, and reflective anodes 444-444C instead of transparent anodes 344A-344C as in pixel 702. Further, red and green CPEs 746A-746B can be disposed on transparent cathode 428 and blue CPE 546C can be disposed on transparent cathode 428C instead of under substrate 212 as in pixel 702.

Figure 9:
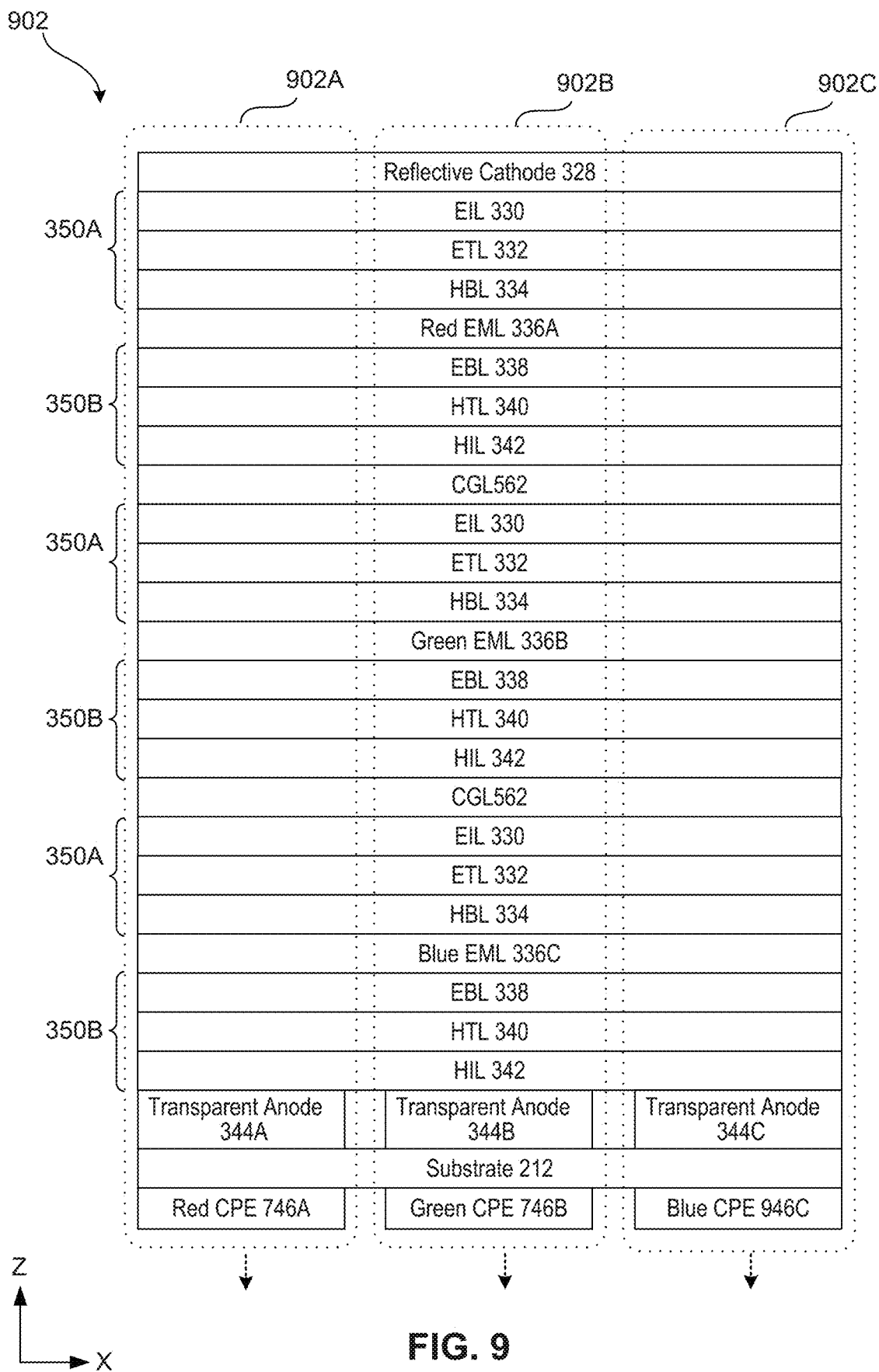

FIG. 9 illustrates a cross-sectional view of a tri-chromatic pixel 902 of a bottom emission LED display device. The discussion of pixel 302 applies to pixel 902 unless mentioned otherwise. In pixel 902, red, green, and blue EMLs 336A-336C can be deposited as a continuous layers within red, green, and blue sub-pixels 902A-902C, instead of separate layers as in pixel 302. In pixel 902, red EML 336A can be disposed on green EML 336B, which can be disposed on blue EML 336C. Also, unlike pixel 302, each of red, green, and blue EMLs 336A-336C can be interposed between stacks 350A-350B, instead of sharing stacks 350A-350B as in pixel 302. Pixel 902 can also include a pair of CGLs 562 configured to provide electrons to overlying layers and holes to underlying layers as shown in FIG. 9.

Further, pixel 902 can include CPEs 746A-746B and 946C under substrate 212 to tune the wavelengths of light emitted from sub-pixels 902A-902C, respectively. Each of CPEs 746A-746B and 946C can have one or more non-phosphor films that exclude luminescent nanostructures such as QDs (e.g., NS 1500 described with reference to FIG. 15). Red CPE 746A can be configured to filter out green and/or blue lights that may emit from portions of EMLs 336B-336C within red sub-pixel 902A, respectively. Green CPE 746B can be configured to filter out red and/or blue lights that may emit from portions of EMLs 336A and 336C within green sub-pixel 902B, respectively. Blue CPE 946C can be configured to filter out red and/or green lights that may emit from portions of EMLs 336A-336B within blue sub-pixel 902B, respectively.

The stacking order of red, green, and blue EMLs 336A-336C can be such that light emitted from red EML 336A is not substantially absorbed by green and/or blue EMLs 336B-336C and light from green EML 336B is not substantially absorbed by blue EML 336C before emitting out of pixel 902. The reason for such stacking order can be similar to that described above with respect to EMLs 336A-336B in FIG. 5.

Figure 10:
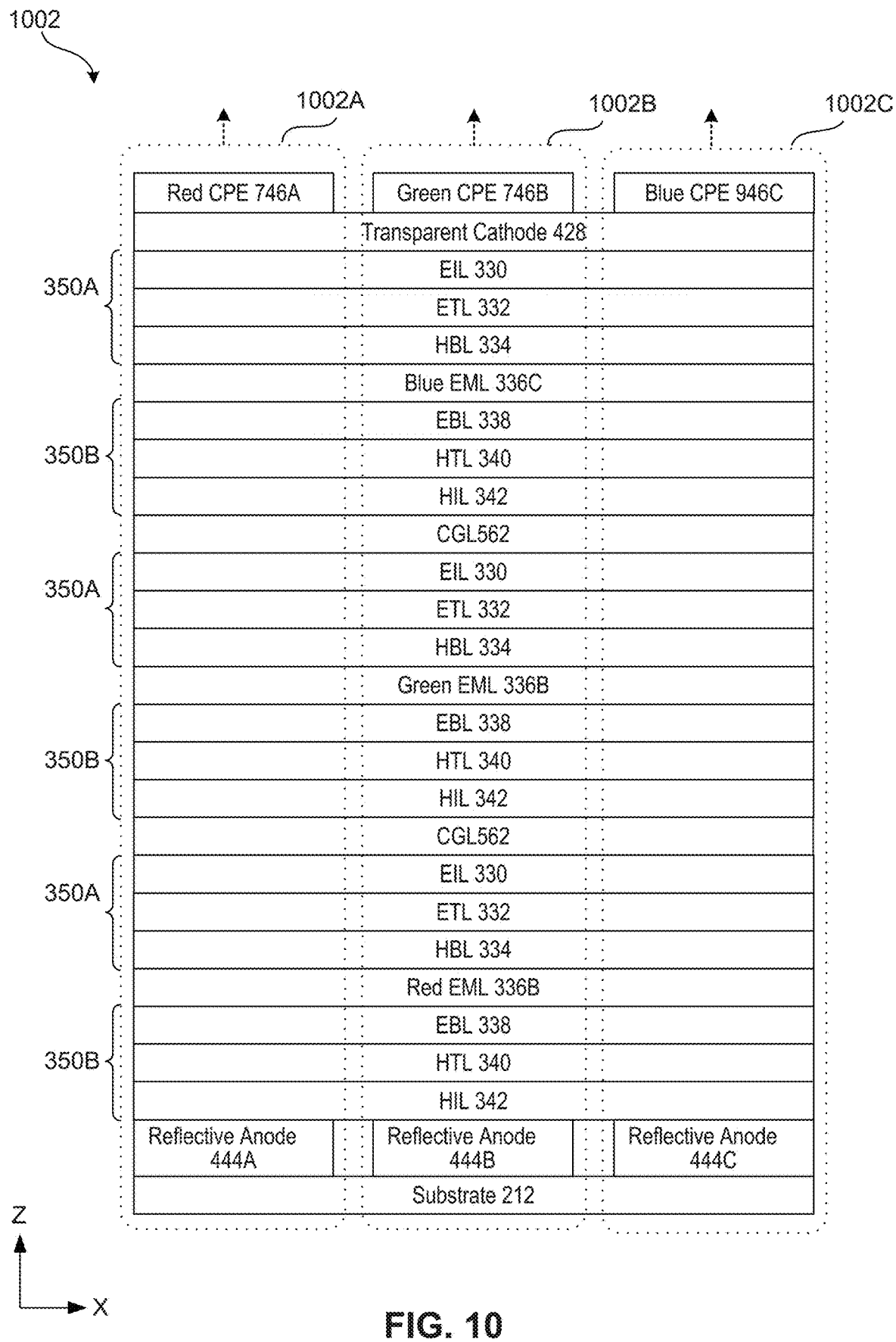

FIG. 10 illustrates a cross-sectional view of a tri-chromatic pixel 1002 of a top emission LED display device. Pixel 1002 can be similar to pixel 902, except in pixel 1002 red, green, and blue lights can be emitted through transparent cathode 428 towards a display screen (e.g., back plate 104) and the stacking order of red, green, and blue EMLs 336A-336C can be opposite to that of pixel 902. In pixel 1002, blue EML 336C can be disposed on green EML 336B, which can be disposed on red EML 336A. The stacking order of red, green, and blue EMLs 336A-336C can be such that light emitted from red EML 336A is not substantially absorbed by green and/or blue EMLs 336B-336C and light from green EML 336B is not substantially absorbed by blue EML 336C before emitting out of pixel 1002. Pixel 1002 can have transparent cathode 428 instead of reflective cathode 328 and reflective anodes 444-444C instead of transparent anodes 344A-344C as in pixel 902. Further, red and green CPEs 746A-746B and blue CPE 946C can be disposed on transparent cathode 428 instead of under substrate 212 as in pixel 902.

Figure 11:
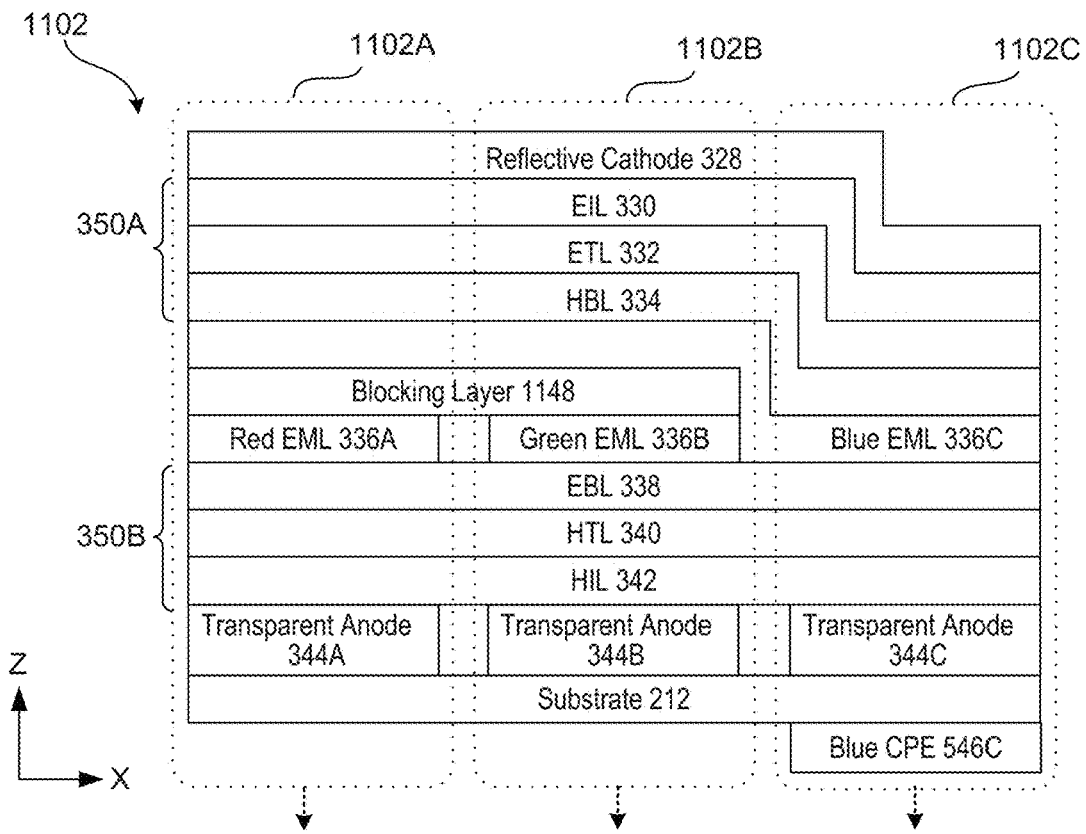

FIG. 11 illustrates a cross-sectional view of a tri-chromatic pixel 1102 of a bottom emission LED display device. The discussion of pixel 302 applies to pixel 1102 unless mentioned otherwise. Unlike pixel 302, pixel 1102 can include blue EML 336C within red, green, and blue sub-pixels 1102A-1102C. In pixel 1102, blue EML 336C can be conformally disposed on top surfaces of red and green EMLs 336A-336B and on side surface of green EML 336B as shown in FIG. 11. To prevent blue light from being emitted from portions of blue EML 336C within red and green sub-pixels 1102A-1102B, pixel 1102 can include a blocking layer 1148 between red and green EMLs 336A-336B and the portions of blue EML 336C within red and green sub-pixels 1102A-1102B, respectively. Blocking layer 1148 can be configured to block hole and/or exciton migration from red and green EMLs 336A-336B to the portions of blue EML 336C within red and green sub-pixels 1102A-1102B, respectively, and prevent generation of blue light within the portions of blue EML 336C due to electron-hole recombination in them. The portion of blue EML 336C within blue sub-pixel 1102C can function similar to blue EML 336C of pixel 302. In some embodiments, blue EML 336C can be conformally disposed on top and side surfaces of blocking layer 1148 as shown in FIG. 11. In some embodiments, blue sub-pixel 1102C can have blue CPE 546C configured to tune the wavelength of the blue light emitted from blue sub-pixel 1102C.

Figure 12:
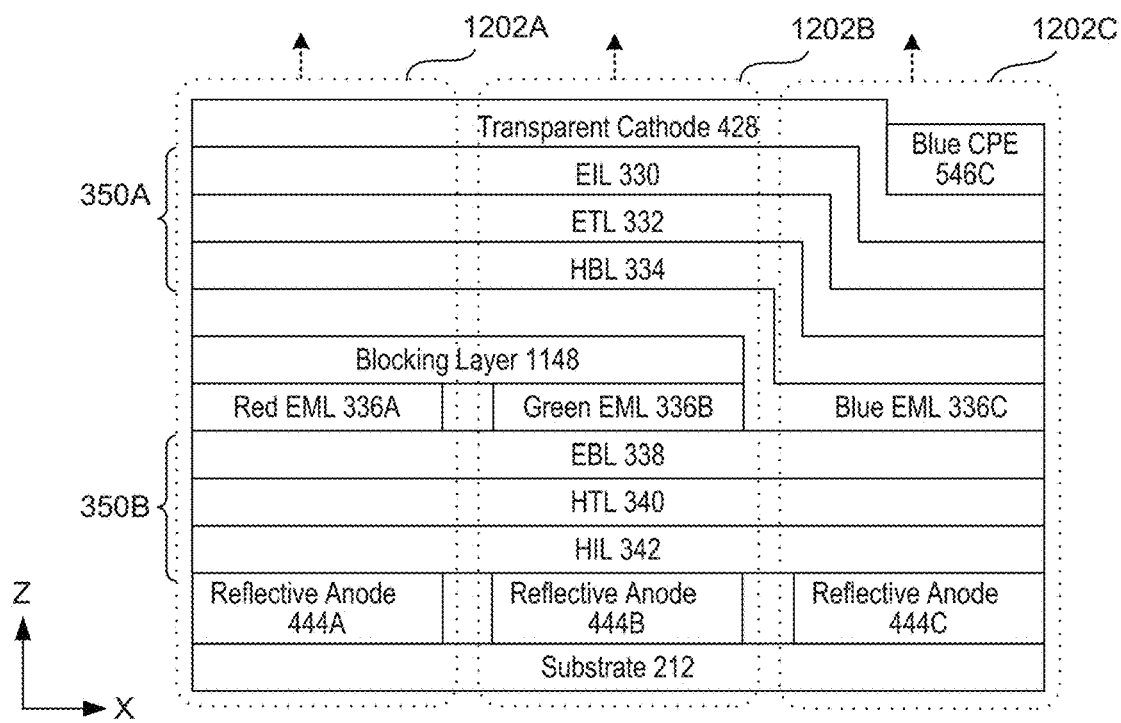

FIG. 12 illustrates a cross-sectional view of a tri-chromatic pixel 1202 of a top emission LED display device. Pixel 1202 can be similar to pixel 1102, except in pixel 1202 red, green, and blue lights can be emitted through transparent cathode 428 towards a display screen (e.g., back plate 104). Pixel 1202 can have transparent cathode 428 instead of reflective cathode 328 and reflective anodes 444-444C instead of transparent anodes 344A-344C as in pixel 1102. Further, blue CPE 546C can be disposed on transparent cathode 428 within blue sub-pixel 1202C instead of under substrate 212 as in pixel 1102.

Figure 13:
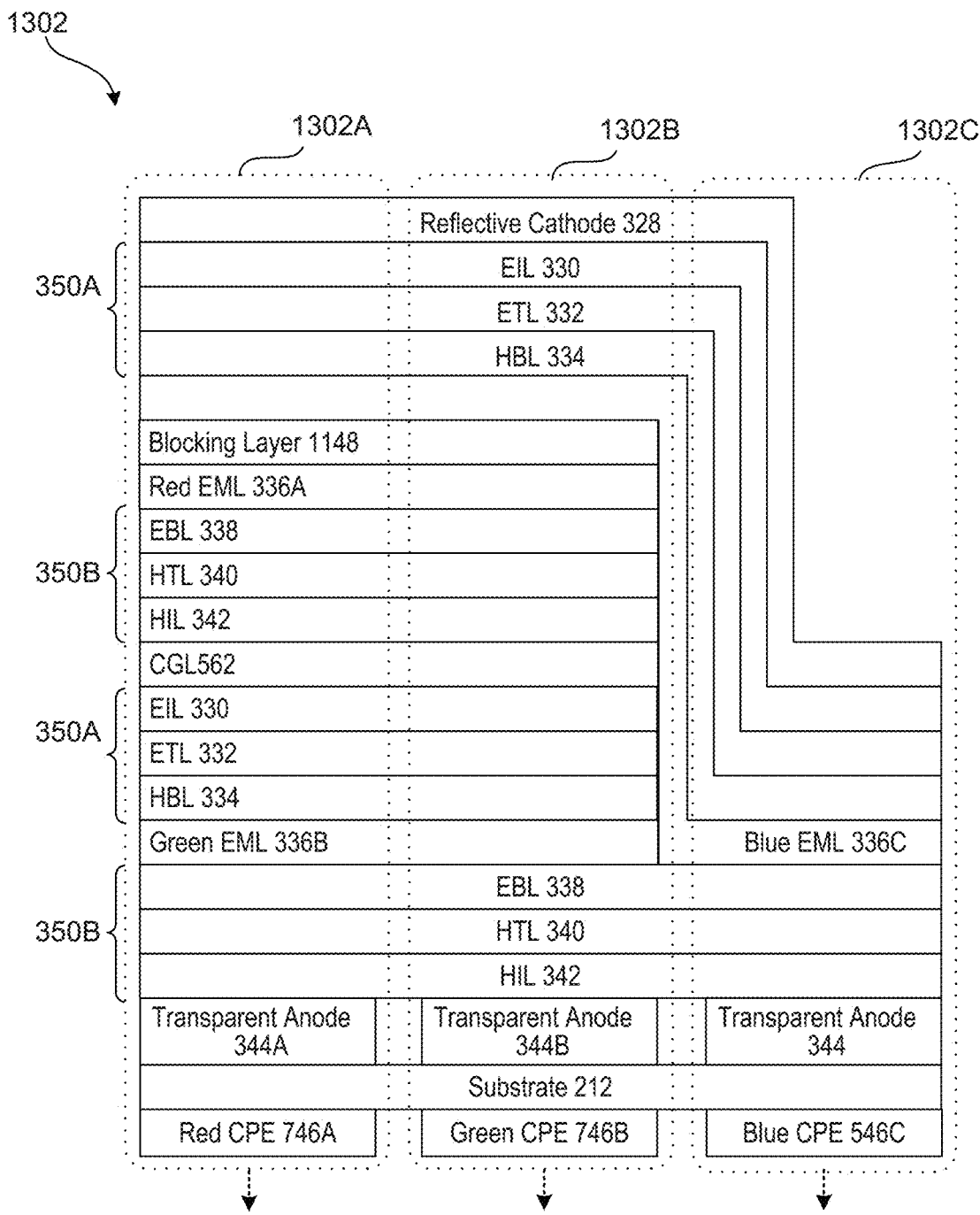

FIG. 13 illustrates a cross-sectional view of a tri-chromatic pixel 1102 of a bottom emission LED display device. Pixel 1302 can be similar to pixel 1102, except red and green EMLs 336A-336B can each be included within red and green sub-pixels 1302A-1302B and red EML 336A can be disposed on green EMLs 336B with stacks 350A-350B and CGL 562 interposed between red and green EMLs 336A-336B. Blocking layer 1148 of pixel 1302 can be conformally deposited on top and side surfaces of red EML 336A and side surfaces of stacks 350A-350B and CGL 562 as shown in FIG. 13.

Figure 14:
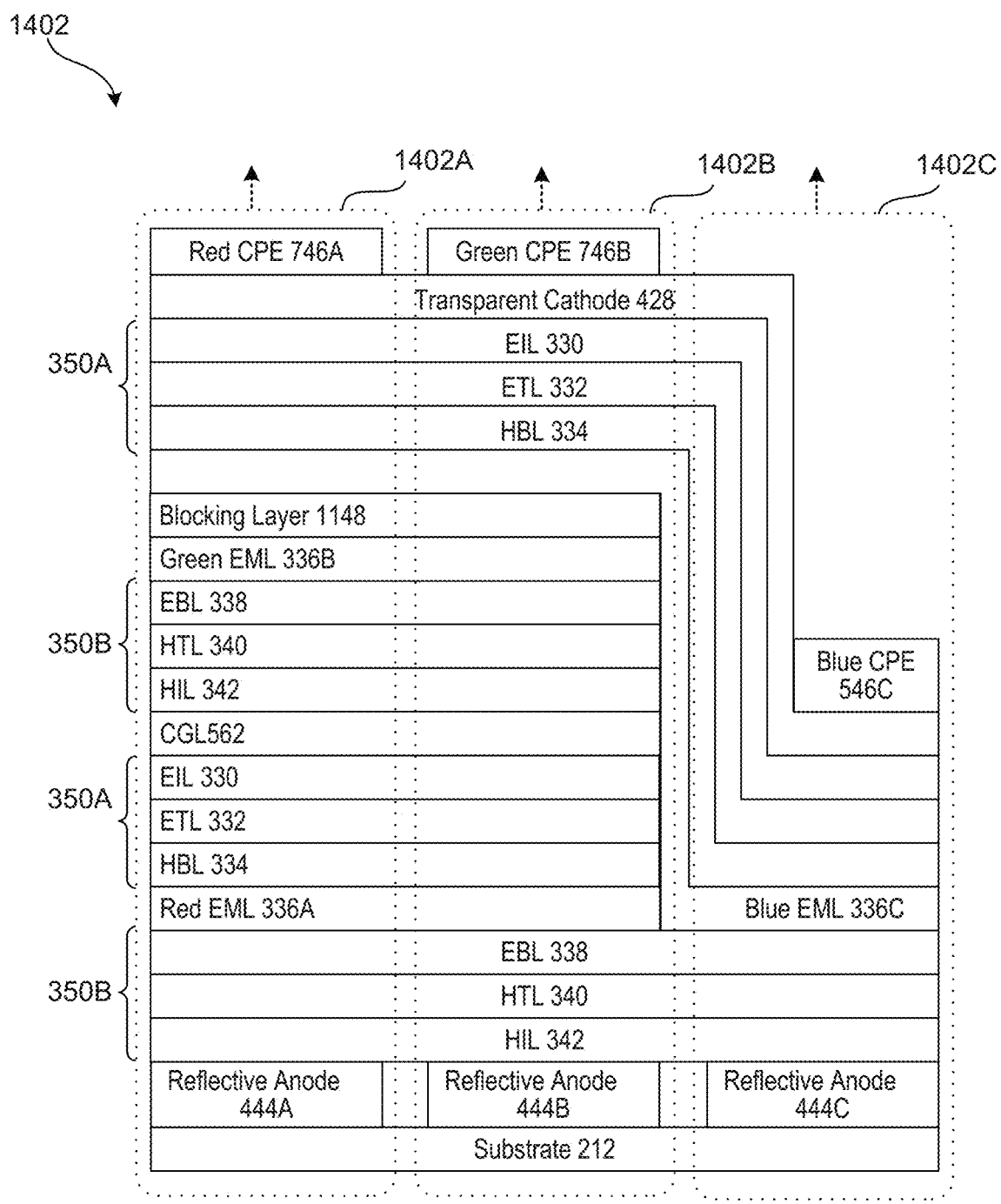

FIG. 14 illustrates a cross-sectional view of a tri-chromatic pixel 1402 of a top emission LED display device. Pixel 1402 can be similar to pixel 1302, except in pixel 1402 red, green, and blue lights can be emitted through transparent cathode 428 towards a display screen (e.g., back plate 104). The stacking order of red and green EMLs 336A-336B can be opposite to that of pixel 1302. Green EML 336B can be disposed on red EML 336A with stacks 350A-350B and CGL 562 interposed between red and green EMLs 336A-336B. In pixel 1402, blocking layer 1148 can be conformally deposited on top and side surfaces of green EML 336B and side surfaces of stacks 350A-350B and CGL 562 as shown in FIG. 14. Pixel 1402 can have transparent cathode 428 instead of reflective cathode 328 and reflective anodes 444-444C instead of transparent anodes 344A-344C as in pixel 1302. Further, blue CPE 546C can be disposed on transparent cathode 428 within blue sub-pixel 1402C instead of under substrate 212 as in pixel 1302.

In some embodiments, red sub-pixels 302A, 502A, 702A, 902A, 1102A, and 1302A, green sub-pixels 302B, 502B, 702B, 902B, 1102B, and 1302B, and blue sub-pixels 302C, 502C, 702C, 902C, 1102C, and 1302C can each include a distributed Bragg reflector (DBR) (not shown) disposed between respective transparent anodes 344A-344C and substrate 212. The DBRs can be configured to provide a partially reflective surface and form optical cavities between the DBRs and reflective cathodes 328 and 328C. The optical cavities can allow photons released/emitted from EMLs 336A-336C to be reflected back and forth between the respective DBRs and reflective cathodes 328 and 328C before being emitted out of respective pixels 302, 502, 702, 902, 1102, and 1302 through substrate 212. The back and forth reflection of the photons can facilitate constructive interference of the photons at a particular wavelength and consequently, output narrower red, green, and blue emission spectrum from the red, green, and blue sub-pixels. In some embodiments, each of the DBRs can include one or more pairs of high index dielectric (HID) layer (e.g., titanium oxide) and low index dielectric (LID) layer (e.g., silicon oxide).

Similarly, in some embodiments, red sub-pixels 402A, 602A, 802A, 1002A, 1202A, and 1402A, green sub-pixels 402B, 602B, 802B, 1002B, 1202B, and 1402B, and blue sub-pixels 402C, 602C, 802C, 1002C, 1202C, and 1402C can each include the DBR (not shown) disposed between respective reflective anodes 444A-444C and substrate 212. In this case, pixels 402, 602, 802, 1002, 1202, and 1402 can each have semitransparent cathode instead of cathodes 428 and/or 428C.

In some embodiments, red sub-pixels 302A, 502A, 702A, 902A, 1102A, and 1302A, green sub-pixels 302B, 502B, 702B, 902B, 1102B, and 1302B, and blue sub-pixels 302C, 502C, 702C, 902C, 1102C, and 1302C can each include an inverted structure with respect to the structures illustrated in FIGS. 3, 5, 7, 9, 11, and 13, respectively. The inverted structures can have the same direction of light emission as the structures illustrated in FIGS. 3, 5, 7, 9, 11, and 13. In the inverted structures, the stacking order of EIL 330, ETL 332, HBL 334, EBL 338, HTL 340, and HIL 342 can be reversed with respect to the stacking order of these layers in Figs. FIGS. 3, 5, 7, 9, 11, and 13. For example, HIL 342 can be over HTL 340, HTL 340 can be over EBL 338, EBL 338 can be over HBL 334, HBL 334 can be over ETL 332, and ETL 332 can be over EIL 330 in these inverted structures.

In addition, reflective cathodes 328 can be replaced by reflective anodes and transparent anodes 344A-344C can be replaced by transparent cathodes in these inverted structures. Similar to reflective cathodes 328, reflective anodes of these inverted structures can include electrically conductive and optically reflective materials, such as aluminum (Al) or silver (Ag), according to some embodiments. Similar to transparent anodes 344A-344C, transparent cathodes of these inverted structures can include electrically conductive and optically transparent materials, such as indium-tin-oxide (ITO), according to some embodiments.

Similarly, in some embodiments, red sub-pixels 402A, 602A, 802A, 1002A, 1202A, and 1402A, green sub-pixels 402B, 602B, 802B, 1002B, 1202B, and 1402B, and blue sub-pixels 402C, 602C, 802C, 1002C, 1202C, and 1402C can each include inverted structures with respect to the structures illustrated in FIGS. 4, 6, 8, 10, 12, and 14, respectively. The inverted structures can have the same direction of light emission as the structures illustrated in FIGS. 4, 6, 8, 10, 12, and 14. In the inverted structures, the stacking order of EIL 330, ETL 332, HBL 334, EBL 338, HTL 340, and HIL 342 can be reversed with respect to the stacking order of these layers in FIGS. 4, 6, 8, 10, 12, and 14. For example, HIL 342 can be over HTL 340, HTL 340 can be over EBL 338, EBL 338 can be over HBL 334, HBL 334 can be over ETL 332, and ETL 332 can be over EIL 330 in these inverted structures.

In addition, transparent cathodes 428 can be replaced by transparent anodes and reflective anodes 444A-444C can be replaced by reflective cathodes in these inverted structures. Similar to transparent cathodes 428, transparent anodes of these inverted structures can include electrically conductive and optically transparent layers, such as a layer of ITO, a multilayer stack of ITO/Ag/ITO, or a thin layer of Ag having a thickness of about 10 nm, according to some embodiments. Similar to reflective anodes 444A-444C, reflective cathodes of these inverted structures can include a non-reflective electrically conductive layer (e.g., ITO) and a reflective layer (e.g., Ag or Al), according to some embodiments.

Example Embodiments of a Barrier Layer Coated Nanostructure

Figure 15:
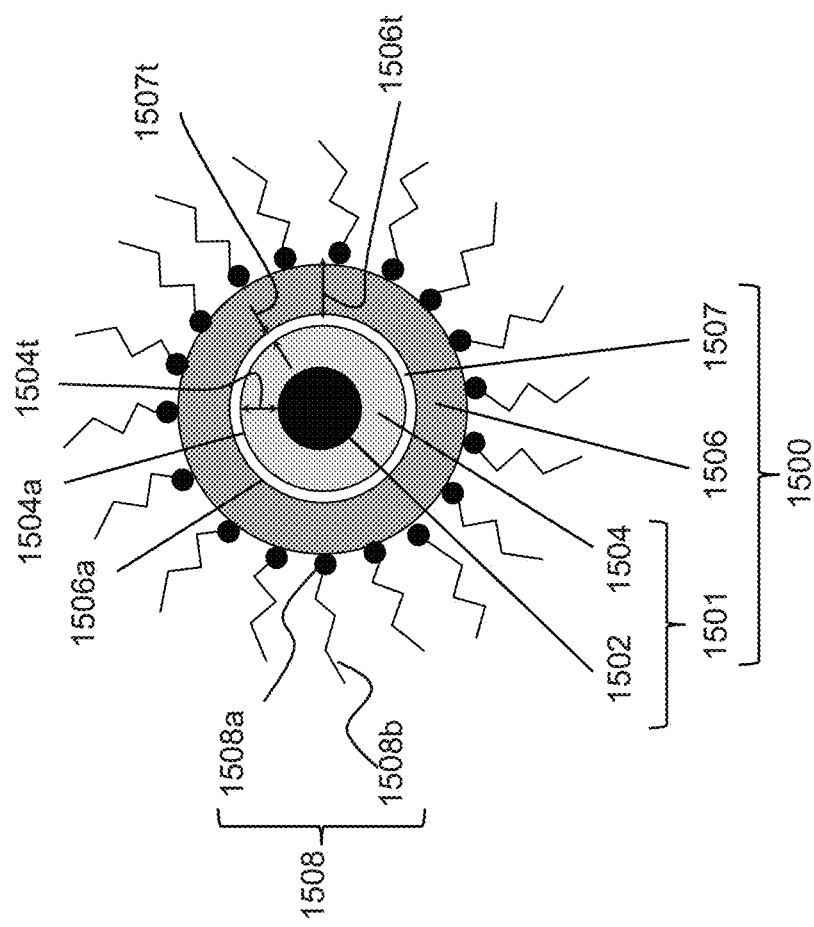
FIG. 15 illustrates a schematic of a cross-sectional view of a nanostructure (NS), according to some embodiments.

FIG. 15 illustrates a cross-sectional structure of a barrier layer coated luminescent nanostructure (NS) 1500, according to some embodiments. In some embodiments, a population of NS 1500 can be included in phosphor films of EMLs 336A-336B. Barrier layer coated NS 1500 includes a NS 1501 and a barrier layer 1506. NS 1501 includes a core 1502 and a shell 1504. Core 1502 includes a semiconducting material that emits light. Examples of the semiconducting material for core 1502 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap can be used as well. In some embodiments, core 1502 can also include one or more dopants such as metals, halogens, and alloys, to provide some examples. Examples of metal dopant can include, but not limited to, zinc (Zn), Copper (Cu), aluminum (Al), platinum (Pt), chrome (Cr), tungsten (W), palladium (Pd), or a combination thereof. Examples of a halogen dopant can include, but are not limited to, fluorine (F), chlorine (Cl), bromine (Br) or iodine (I). The presence of one or more dopants in core 1502 can improve structural, electrical, and/or optical stability and QY of NS 1501 compared to undoped NSs.

Core 1502 can have a size of less than 20 nm in diameter, according to some embodiments. In another embodiment, core 1502 can have a size between about 1 nm and about 10 nm in diameter. The ability to tailor the size of core 1502, and consequently the size of NS 1501 in the nanometer range enables photoemission coverage in the entire optical spectrum. In general, the larger NSs emit light towards the red end of the spectrum, while smaller NSs emit light towards the blue end of the spectrum. This effect arises as larger NSs have energy levels that are more closely spaced than the smaller NSs. This allows the NS to absorb photons containing less energy, i.e. those closer to the red end of the spectrum.

Shell 1504 surrounds core 1502 and is disposed on outer surface of core 1502. Shell 1504 can include, but is not limited to, cadmium sulfide (CdS), zinc cadmium sulfide (ZnCdS), zinc selenide sulfide (ZnSeS), and zinc sulfide (ZnS). In some embodiments, shell 1504 can have a thickness 1504$t$, for example, one or more monolayers. In other embodiments, shell 1504 can have a thickness 1504$t$ between about 1 nm and about 10 nm. Shell 1504 can be utilized to help reduce the lattice mismatch with core 1502 and improve the QY of NS 1501. Shell 1504 can also help to passivate and remove surface trap states, such as dangling bonds, on core 1502 to increase QY of NS 1501. The presence of surface trap states can provide non-radiative recombination centers and contribute to lowered emission efficiency of NS 1501.

In alternate embodiments, NS 1501 can include a second shell disposed on shell 1504, or more than two shells surrounding core 1502, without departing from the spirit and scope of the present invention. In some embodiments, the second shell can be one or more monolayers thick and is typically, though not required, also a semiconducting material. Second shell can provide protection to core 1502. Second shell material can be zinc sulfide (ZnS), although other materials can be used, and dopants can be included as well, without deviating from the scope or spirit of the invention.

Barrier layer 1506 is configured to form a coating on NS 1501. In some embodiments, barrier layer 1506 is disposed on and in substantial contact with outer surface 1504$a$ of shell 1504. In embodiments of NS 1501 having one or more shells, barrier layer 1506 can be disposed on and in substantial contact with the outermost shell of NS 1501. In an example embodiment, barrier layer 1506 is configured to act as a spacer between NS 1501 and one or more NSs in, for example, a solution, a composition, and/or a film having a plurality of NSs, where the plurality of NSs can be similar to NS 1501 and/or barrier layer coated NS 1500. In such NS solutions, NS compositions, and/or NS films, barrier layer 1506 can help to prevent aggregation of NS 1501 with adjacent NSs. Aggregation of NS 1501 with adjacent NSs can lead to increase in size of NS 1501 and consequent reduction or quenching in the optical emission properties of the aggregated NS (not shown) including NS 1501. In further embodiments, barrier layer 1506 provides protection to NS 1501 from, for example, moisture, air, and/or harsh environments (e.g., high temperatures and chemicals used during lithographic processing of NSs and/or during manufacturing process of NS based devices) that can adversely affect the structural and optical properties of NS 1501.

Barrier layer 1506 can include one or more materials that are amorphous, optically transparent and/or electrically inactive. Suitable barrier layers include inorganic materials, such as, but not limited to, inorganic oxides, halides, and/or nitrides. Examples of materials for barrier layer 1506 include oxides and/or nitrides of Al, Ba, Ca, Mg, Ni, Si, Ti, or Zr, according to various embodiments. Barrier layer 1506 can have a thickness 1506$t$ ranging from about 0.5 nm to about 15 nm in various embodiments.

Barrier layer coated NS 1500 can additionally or optionally include a buffer layer 1507 configured to form a buffered coating on NS 1501. In some embodiments, buffer layer 107 is disposed on shell 1504 and in substantial contact with outer surface 1504$a$ of shell 1504 and inner surface 1506$a$ of barrier layer 1506. Buffer layer 107 can be configured to act as a buffer between NS 1501 and chemicals used during subsequent processing on NS 1501, such as formation of barrier layer 1506 on NS 1501.

Buffer layer 107 can help to substantially reduce and/or prevent quenching in the optical emission properties of NS 1501 due to reaction with chemicals used during subsequent processing on NS 1501. Buffer layer 1507 can include one or more materials that are amorphous, optically transparent and/or electrically active. The one or more materials of buffer layer 1507 can include inorganic or organic materials. Examples of inorganic materials for buffer layer 1507 include oxides and/or nitrides of metals, according to various embodiments. Examples for metal oxides include ZnO, $TiO_2$, $In_2O_3$, $Ga_2O_3$, $SnO_2$, $Al_2O_3$, or MgO. Buffer layer 1507 can have a thickness 1507$t$ ranging from about 1 nm to about 5 nm in various embodiments.

As illustrated in FIG. 15, barrier layer coated NS 1500 can additionally or optionally include a plurality of ligands or surfactants 1508, according to some embodiments. Ligands or surfactants 1508 can be adsorbed or bound to an outer surface of barrier layer coated NS 1500, such as on an outer surface of barrier layer 1506, or outer surface of shell 1504 or second shell, according to some embodiments. The plurality of ligands or surfactants 1508 can include hydrophilic or polar heads 1508$a$ and hydrophobic or non-polar tails 1508$b$. The hydrophilic or polar heads 1508$a$ can be bound to barrier layer 1506. The presence of ligands or surfactants 1508 can help to separate NS 1500 and/or NS 1501 from other NSs in, for example, a solution, a composition, and/or a film during their formation. If the NSs are allowed to aggregate during their formation, the quantum efficiency of NSs such as NS 1500 and/or NS 1501 can drop. Ligands or surfactants 1508 can also be used to impart certain properties to barrier layer coated NS 1500, such as hydrophobicity to provide miscibility in non-polar solvents, or to provide reaction sites (e.g., reverse micellar systems) for other compounds to bind.

A wide variety of ligands exist that can be used as ligands 1508. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is a thiol, for example, octanethiol. In some embodiments, the ligand is diphenylphosphine. In some embodiments, the ligand is a neutral salt of any of these fatty acids, or a chalcogenide of any of these amines, phosphines, or phosphine oxides, for example, zinc oleate, zinc laurate, TOP-selenide, or TOP-sulfide.

A wide variety of surfactants exist that can be used as surfactants 1508. Nonionic surfactants can be used as surfactants 1508 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants can be used as surfactants 1508 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, NSs 1501 and/or 1500 can be synthesized to emit light in one or more various color ranges, such as red, orange, and/or yellow range. In some embodiments, NSs 1501 and/or 1500 can be synthesized to emit light in the green and/or yellow range. In some embodiments, NSs 1501 and/or 1500 can be synthesized emit light in the blue, indigo, violet, and/or ultra-violet range. In some embodiments, NSs 1501 and/or 1500 can be synthesized to have a primary emission peak wavelength between about 605 nm and about 650 nm, between about 510 nm and about 550 nm, or between about 300 nm and about 495 nm.

NSs 1501 and/or 1500 can be synthesized to display a high QY. In some embodiments, NSs 1501 and/or 1500 can be synthesized to display a QY between 80% and 100% or between 85% and 90%.

Thus, according to various embodiments, NSs 1500 can be synthesized such that the presence of barrier layer 1506 on NSs 1501 does not substantially change or quench the optical emission properties of NSs 1501.

Example Embodiments of a Nanostructure Film

Figure 16:
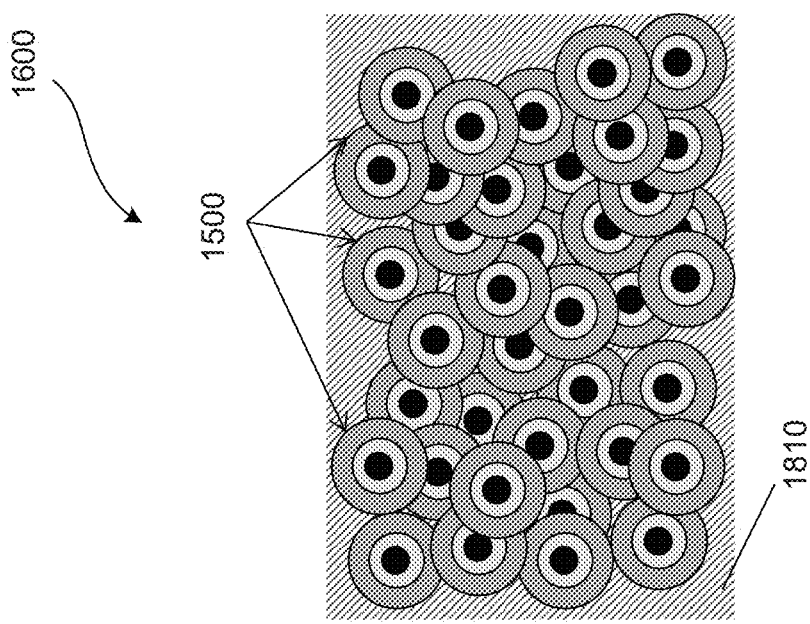
FIG. 16 illustrates a schematic of a NS film, according to some embodiments.

FIG. 16 illustrates a cross-sectional view of a NS film 1600, according to some embodiments. In some embodiments, phosphor films of EMLs 336A-336B can be similar to NS film 1600.

NS film 1600 can include a plurality of barrier layer coated core-shell NSs 1500 (FIG. 15) and a matrix material 1610, according to some embodiments. NSs 1500 can be embedded or otherwise disposed in matrix material 1610, according to some embodiments. As used herein, the term "embedded" is used to indicate that the NSs are enclosed or encased within matrix material 1610. It should be noted that NSs 1500 can be uniformly distributed throughout matrix material 1610 in some embodiments, though in other embodiments NSs 1500 can be distributed according to an application-specific uniformity distribution function. It should be noted that even though NSs 1500 are shown to have the same size in diameter, a person skilled in the art would understand that NSs 1500 can have a size distribution.

In some embodiments, NSs 1500 can include a homogenous population of NSs having sizes that emit in the blue visible wavelength spectrum, in the green visible wavelength spectrum, or in the red visible wavelength spectrum. In other embodiments, NSs 1500 can include a first population of NSs having sizes that emit in the blue visible wavelength spectrum, a second population of NSs having sizes that emit in the green visible wavelength spectrum, and a third population of NSs that emit in the red visible wavelength spectrum.

Matrix material 1610 can be any suitable host matrix material capable of housing NSs 1500. Suitable matrix materials can be chemically and optically compatible with NSs 1500 and any surrounding packaging materials or layers used in applying NS film 1600 to devices. Suitable matrix materials can include non-yellowing optical materials which are transparent to both the primary and secondary light, thereby allowing for both primary and secondary light to transmit through the matrix material. In some embodiments, matrix material 1610 can completely surround each of the NSs 1500. The matrix material 1610 can be flexible in applications where a flexible or moldable NS film 1600 is desired. Alternatively, matrix material 1610 can include a high-strength, non-flexible material.

Matrix material 1610 can include polymers, other semiconducting nanoparticles, organic and inorganic oxides, or other semiconducting or insulating materials. Suitable polymers for use in matrix material 1610 can be any polymer known to the ordinarily skilled artisan that can be used for such a purpose. The polymer can be substantially translucent or substantially transparent. Matrix material 1610 can include, but not limited to, epoxies, acrylates, norbornene, polyethylene, poly(vinyl butyral):poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides which combine with ligand amines (e.g., APS or PEI ligand amines) to form epoxy, and the like.

In some embodiments, matrix material 1610 includes scattering microbeads such as TiO2 microbeads, ZnS microbeads, or glass microbeads that can improve photo conversion efficiency of NS film 1600. In some embodiments, matrix material 1610 can include conductive or semiconductive materials.

In another embodiment, matrix material 1610 can have low oxygen and moisture permeability, exhibit high photo- and chemical-stability, exhibit favorable refractive indices, and adhere to outer surfaces of NSs 1500, thus providing an air-tight seal to protect NSs 1500. In another embodiment, matrix material 1610 can be curable with UV or thermal curing methods to facilitate roll-to-roll processing.

According to some embodiments, NS film 1600 can be formed by mixing NSs 1500 in a polymer (e.g., photoresist) and casting the NS-polymer mixture on a substrate, mixing NSs 1500 with monomers and polymerizing them together, mixing NSs 1500 in a sol-gel to form an oxide, or any other method known to those skilled in the art.

Example Embodiments of Luminescent Nanostructures

Described herein are various compositions having luminescent nanostructures (NSs). The various properties of the luminescent nanostructures, including their absorption properties, emission properties and refractive index properties, can be tailored and adjusted for various applications.

The material properties of NSs can be substantially homogenous, or in certain embodiments, can be heterogeneous. The optical properties of NSs can be determined by their particle size, chemical or surface composition. The ability to tailor the luminescent NS size in the range between about 1 nm and about 20 nm can enable photoemission coverage in the entire optical spectrum to offer great versatility in color rendering. Particle encapsulation can offer robustness against chemical and UV deteriorating agents.

Luminescent NSs, for use in embodiments described herein can be produced using any method known to those skilled in the art. Suitable methods and example nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties.

Luminescent NSs for use in embodiments described herein can be produced from any suitable material, including an inorganic material, and more suitably an inorganic conductive or semiconductive material. Suitable semiconductor materials can include those disclosed in U.S. patent application Ser. No. 10/796,832, and can include any type of semiconductor, including group II-VI, group III-V, group IV-VI, group and group IV semiconductors. Suitable semiconductor materials can include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SuS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, CuInGaS, CuInGaSe, and an appropriate combination of two or more such semiconductors.

In certain embodiments, the luminescent NSs can have a dopant from the group consisting of a p-type dopant or an n-type dopant. The NSs can also have II-VI or III-V semiconductors. Examples of II-VI or III-V semiconductor NSs can include any combination of an element from Group II, such as Zn, Cd and Hg, with any element from Group VI, such as S, Se, Te and Po, of the Periodic Table; and any combination of an element from Group III, such as B, Al, Ga, In, and Tl, with any element from Group V, such as N, P, As, Sb and Bi, of the Periodic Table.

The luminescent NSs, described herein can also further include ligands conjugated, cooperated, associated or attached to their surface. Suitable ligands can include any group known to those skilled in the art, including those disclosed in U.S. Pat. No. 8,283,412; U.S. Patent Publication No. 2008/0237540; U.S. Patent Publication No. 2010/0110728; U.S. Pat. Nos. 8,563,133; 7,645,397; 7,374,807; 6,949,206; 7,572,393; and 7,267,875, the disclosures of each of which are incorporated herein by reference. Use of such ligands can enhance the ability of the luminescent NSs to incorporate into various solvents and matrixes, including polymers. Increasing the miscibility (i.e., the ability to be mixed without separation) of the luminescent NSs in various solvents and matrixes can allow them to be distributed throughout a polymeric composition such that the NSs do not aggregate together and therefore do not scatter light. Such ligands are described as "miscibility-enhancing" ligands herein.

In certain embodiments, compositions having luminescent NSs distributed or embedded in a matrix material are provided. Suitable matrix materials can be any material known to the ordinarily skilled artisan, including polymeric materials, organic and inorganic oxides. Compositions described herein can be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting NSs (for example, as disclosed in U.S. Pat. No. 7,374,807) utilize the emission properties of luminescent nanostructures that are tailored to absorb light of a particular wavelength and then emit at a second wavelength, thereby providing enhanced performance and efficiency of active sources (e.g., LEDs).

While any method known to the ordinarily skilled artisan can be used to create luminescent NSs, a solution-phase colloidal method for controlled growth of inorganic nanomaterial phosphors can be used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," *J. Am. Chem. Soc.* 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," *J Am. Chem. Soc.* 115:8706 (1993), the disclosures of which are incorporated by reference herein in their entireties.

According to some embodiments, CdSe can be used as the NS material, in one example, for visible light down-conversion, due to the relative maturity of the synthesis of this material. Due to the use of a generic surface chemistry, it can also possible to substitute non-cadmium-containing NSs.

In semiconductor NSs, photo-induced emission arises from the band edge states of the NS. The band-edge emission from luminescent NSs competes with radiative and non-radiative decay channels originating from surface electronic states. X. Peng, et al., *J Am. Chem. Soc.* 30:7019-7029 (1997). As a result, the presence of surface defects such as dangling bonds provide non-radiative recombination centers and contribute to lowered emission efficiency. An efficient and permanent method to passivate and remove the surface trap states can be to epitaxially grow an inorganic shell material on the surface of the NS. X. Peng, et al., *J. Am. Chem. Soc.* 30:701 9-7029 (1997). The shell material can be chosen such that the electronic levels are type 1 with respect to the core material (e.g., with a larger bandgap to provide a potential step localizing the electron and hole to the core). As a result, the probability of non-radiative recombination can be reduced.

Core-shell structures can be obtained by adding organometallic precursors containing the shell materials to a reaction mixture containing the core NSs. In this case, rather than a nucleation event followed by growth, the cores act as the nuclei, and the shells can grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and to ensure solubility. A uniform and epitaxially grown shell can be obtained when there is a low lattice mismatch between the two materials.

Example materials for preparing core-shell luminescent NSs can include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuP, CuCl, CuBr, CuI, $Si_3N_4$, $Ge_3N_4$, $Al_2O_3$, $(Al, Ga, In)_2 (S, Se, Te)_3$, AlCO, and shell luminescent NSs for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

Luminescent NSs for use in the embodiments described herein can be less than about 100 nm in size, and down to less than about 1 nm in size and absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. Blue light can comprise light between about 435 nm and about 495 nm, green light can comprise light between about 495 nm and 570 nm and red light can comprise light between about 620 nm and about 750 nm in wavelength.

According to various embodiments, the luminescent NSs can have a size and a composition such that they absorb photons that are in the ultraviolet, near-infrared, and/or infrared spectra. The ultraviolet spectrum can comprise light between about 100 nm to about 400 nm, the near-infrared spectrum can comprise light between about 750 nm to about 100 μm in wavelength, and the infrared spectrum can comprise light between about 750 nm to about 300 μm in wavelength.

While luminescent NSs of other suitable material can be used in the various embodiments described herein, in certain embodiments, the NSs can be ZnSe, ZnTe, ZnS, InAs, InP, CdSe, or any combination thereof to form a population of nanocrystals for use in the embodiments described herein. As discussed above, in further embodiments, the luminescent NSs can be core/shell nanocrystals, such as CdSe/ZnS, InP/ZnSe, CdSe/CdS or InP/ZnS.

Suitable luminescent nanostructures, methods of preparing luminescent nanostructures, including the addition of various solubility-enhancing ligands, can be found in Published U.S. Patent Publication No. 2012/0113672, the disclosure of which is incorporated by reference herein in its entirety.

It is to be understood that while certain embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments can be practiced otherwise than as specifically described.

What is claimed is:

1. A display device comprising:
    a first sub-pixel comprising:
        a first light source having a quantum dot (QD) film, a blocking layer disposed on the QD film, and a first portion of an organic phosphor film disposed on the blocking layer,
        wherein the blocking layer is configured to prevent emission of light from the first portion of the organic phosphor film and the QD film is configured to emit a primary emission peak wavelength in a red, green, cyan, yellow, or magenta wavelength region of an electromagnetic (EM) spectrum, and
        a first substrate configured to support the first light source; and
    a second sub-pixel comprising:
        a second light source having a second portion of the organic phosphor film disposed adjacent to the QD film, wherein the second portion of the organic phosphor film is configured to emit a primary emission peak wavelength in a blue, violet, or ultraviolet wavelength region of an EM spectrum, and
        a second substrate configured to support the second light source.

2. The display device of claim 1, wherein the organic phosphor film is a continuous film within the first and second sub-pixels.

3. The display device of claim 1, wherein the organic phosphor film is disposed on a top surface of the blocking layer and on a side surface of the QD film.

4. The display device of claim 1, wherein the second sub-pixel further comprises a non-phosphor film configured to filter out one or more wavelengths or a range of wavelengths in the blue, violet, or ultraviolet wavelength region of the EM spectrum.

5. The display device of claim 1, further comprising a reflective cathode and a transparent or semitransparent anode, wherein the QD film and the organic phosphor film are disposed between the reflective cathode and the transparent or semitransparent anode.

6. The display device of claim 1, further comprising a transparent or semitransparent cathode and a reflective anode, wherein the QD film and the organic phosphor film are disposed between the transparent or semitransparent cathode and the reflective anode.

7. The display device of claim 1, wherein the first light source further comprises a cathode, an anode, and a distributed Bragg reflector (DBR); and
    wherein the DBR is disposed between the anode and the first substrate or between the cathode and the first substrate and is configured to form an optical cavity between the cathode and the DBR or between the anode and the DBR, respectively.

8. The display device of claim 1, wherein the display device is a bottom emission display device.

9. The display device of claim 1, wherein the display device is a top emission display device.

10. A display device having a pixel, the pixel comprising:
    first and second emission layers having quantum dot (QD) films configured to emit first and second lights having first and second peak wavelengths, respectively, wherein the first and second peak wavelengths are different from each other;
    a third emission layer having an organic phosphor film configured to emit a third light having a third peak wavelength different from the first and second peak wavelengths, wherein a first portion of the third emission layer is disposed on the first emission layer and a second portion of the third emission layer is disposed adjacent to the first and second emission layers; and
    a blocking layer disposed between the first emission layer and the first portion of the third emission layer, wherein the blocking layer is configured to prevent emission of light from the first portion of the third emission layer.

11. The display device of claim 10, wherein the first, second, and third peak wavelengths are primary emission peak wavelengths in red, green, and blue wavelength regions of an electromagnetic (EM) spectrum, respectively.

12. The display device of claim 10, wherein the display device is a bottom emission display device and the first emission layer configured to emit red light is disposed on the second emission layer configured to emit green light.

13. The display device of claim 10, wherein the display device is a top emission display device and the second emission layer configured to emit green light is disposed on the first emission layer configured to emit red light.

14. The display device of claim 10, further comprising first, second, and third non-phosphor films configured to filter out one or more wavelengths or a range of wavelengths from the first, second, and third lights, respectively.

15. The display device of claim 10, further comprising an electron injection layer and a hole injection layer disposed between the first and second emission layers,
    wherein the second portion of the third emission layer is disposed on side surfaces of the electron injection layer and the hole injection layer.

16. The display device of claim 10, further comprising a cathode disposed on the first emission layer, wherein the second portion of the third emission layer is disposed on a side surface of the electron injection layer and the hole injection layer.

\* \* \* \* \*